(12) United States Patent
Ikeda et al.

(10) Patent No.: US 6,535,965 B1
(45) Date of Patent: *Mar. 18, 2003

(54) SEMICONDUCTOR MEMORY DEVICE WITH FAST MASKING PROCESS IN BURST WRITE MODE

(75) Inventors: Hitoshi Ikeda, Kawasaki (JP); Yasuharu Sato, Kawasaki (JP); Takaaki Suzuki, Kawasaki (JP); Toshiya Uchida, Kawasaki (JP); Kotoku Sato, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/559,099

(22) Filed: Apr. 27, 2000

(30) Foreign Application Priority Data

Jul. 23, 1999 (JP) .......................................... 11-209734

(51) Int. Cl.[7] .............................................. G06F 12/00
(52) U.S. Cl. ...................... 711/154; 711/152; 711/170
(58) Field of Search ................................ 711/154, 105, 711/155, 103, 152, 170; 710/107, 58; 365/120, 233, 238.5, 189.01

(56) References Cited

U.S. PATENT DOCUMENTS

| | | | | |
|---|---|---|---|---|
| 5,185,694 A | * | 2/1993 | Edenfield et al. ............ 710/107 |
| 5,488,711 A | * | 1/1996 | Hewitt et al. ................ 711/103 |
| 5,657,287 A | * | 8/1997 | McLaury et al. ....... 365/230.01 |
| 5,749,086 A | * | 5/1998 | Ryan ........................... 711/105 |
| 5,802,586 A | * | 9/1998 | Jones et al. .................. 711/155 |
| 5,940,328 A | * | 8/1999 | Iwamoto et al. ........ 365/189.01 |
| 6,002,615 A | * | 12/1999 | Sawada .................. 365/189.01 |
| 6,034,916 A | * | 3/2000 | Lee ............................. 365/233 |
| 6,072,749 A | * | 6/2000 | Nakamura et al. ........ 365/238.5 |
| 6,188,639 B1 | * | 2/2001 | Sakakibara .................. 365/233 |
| 6,192,429 B1 | * | 2/2001 | Jeong et al. .................. 710/58 |
| 6,205,046 B1 | * | 3/2001 | Maesako .................... 365/120 |
| 6,240,043 B1 | * | 5/2001 | Hanson et al. .............. 365/233 |

FOREIGN PATENT DOCUMENTS

JP    10-208468    8/1998

* cited by examiner

*Primary Examiner*—David Hudspeth
*Assistant Examiner*—Fred F. Tzeng
(74) *Attorney, Agent, or Firm*—Arent Fox Kintner Plotkin & Kahn, PLLC

(57) ABSTRACT

A semiconductor memory device has a burst write mode in which predetermined plural command signals are input through a plurality of command pads and a mask control operation in the burst write mode is performed in response to the command signals. Therefore, the mask control in burst write mode is increased in speed to give an improved data transfer rate.

13 Claims, 27 Drawing Sheets

| DM1 | DM2 | DQ1 | DQ2 |
|-----|-----|-------|-------|
| L | L | WRITE | WRITE |
| L | H | WRITE | MASK |
| H | L | MASK | WRITE |

| /WE1 | /WE2 | DQ1 | DQ2 |
|---|---|---|---|
| L | L | WRITE | WRITE |
| L | H | WRITE | MASK |
| H | L | MASK | WRITE |

| DM1 | DM2 | DQ1 | DQ2 |
|-----|-----|-------|-------|
| L | L | WRITE | WRITE |
| L | H | WRITE | MASK |
| H | L | MASK | WRITE |

| BLS1 | BLS2 | |
|---|---|---|
| L | L | BL=1 (bl1z=H) |
| H | L | BL=2 (bl2z=H) |
| L | H | BL=4 (bl4z=H) |
| H | H | BL=8 (bl8z=H) |

| /WE1 | /WE2 | |
|---|---|---|
| L | L | BL=1 (bl1z=H) |
| H | L | BL=2 (bl2z=H) |
| L | H | BL=4 (bl4z=H) |

US 6,535,965 B1

SEMICONDUCTOR MEMORY DEVICE WITH FAST MASKING PROCESS IN BURST WRITE MODE

BACKGROUND OF THE INVENTION

1. Field of the Invention

The present invention relates to a semiconductor memory device and, in particular, to a semiconductor memory device having a burst write mode.

2. Description of the Related Art

In recent years, the performance of parts of computers and other information processing systems has greatly improved. Thus, for semiconductor memory device such as SDRAM (Synchronous Dynamic Random Access Memory), for example, a higher operating speed and an improved data transfer rate, including a multi-bit input/output configuration, are sought.

Specifically, a double data rate (DDR) has come to be employed as a means for increasing the operating speed, in which the clock frequency is increased or data are input or output at both the leading edge and the trailing edge of the clock without increasing the clock frequency.

With the increase in transfer rate, the operation requirement in the circuits cannot be met by writing or reading the data bit by bit. Burst processing (burst read and burst write) for collectively processing several bits of serially input data is required.

At the time of write operation for burst processing (burst write mode), the actual write operation into the core is required to be held before all the data are ready (until the write data for the burst length is prepared). A higher speed of the processing in burst write mode is desired.

The related art and the problem points thereof will be described in detail with reference to the accompanying drawings.

SUMMARY OF THE INVENTION

An object of the present invention is to improve the data transfer rate by increasing the speed of the masking process in the burst write mode. Another object of the invention is to set the burst length without inputting a mode register set command.

According to the present invention, there is provided a semiconductor memory device having a burst write mode wherein predetermined plural command signals are input through a plurality of command pads, and a mask control operation is performed in the burst write mode in response to the command signals.

The command signals may be a plurality of write enable signals input in parallel through the plurality of the command pads and the plurality of the write enable signals may be decoded thereby to mask an arbitrary one of a plurality of continuous write data in the burst write mode.

Further, according to the present invention, there is provided a semiconductor memory device having a burst write mode, wherein mask data are input in parallel through a plurality of mask data pads, and a mask control operation is performed in the burst write mode by the plurality of the mask data.

The number of the mask data pads may be smaller than the number of bits of the burst length in the burst write mode, and the mask control operation for a plurality of bits of the write data may be performed by the mask data input through one of the mask data pads.

The mask control operation in the burst write mode may be performed in such a manner that the mask data corresponding to a plurality of the write data are completely fetched before the plurality of the write data of the burst length are fetched completely.

In addition, according to the present invention, there is provided a semiconductor memory device having a burst write mode, wherein a plurality of input data are provided in serial to a data terminal and a plurality of mask data are provided, comprising a mask data input circuit for receiving the plurality of mask data before the last input data of the plurality of input data is provided to the data terminal.

The semiconductor memory device may further comprise a plurality of write enable signal terminals for receiving a plurality of write enable signals as the plurality of mask data, wherein the mask data input circuit may be coupled to the plurality of write enable signal terminals.

The semiconductor memory device may further comprise a plurality of mask data terminals for receiving the plurality of mask data, wherein the mask data input circuit may be coupled to the plurality of mask data terminals. The number of the mask data terminals may be the same as that of the mask data. The number of the mask data terminals may be less than that of the mask data.

The semiconductor memory device may further comprise a plurality of address signal terminals for receiving the plurality of mask data, wherein the mask data input circuit may be coupled to the plurality of address signal terminals.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

Before explaining embodiments of the semiconductor memory device according to this invention, a semiconductor device according to the related art and the problem points thereof will be explained.

Figure 1:
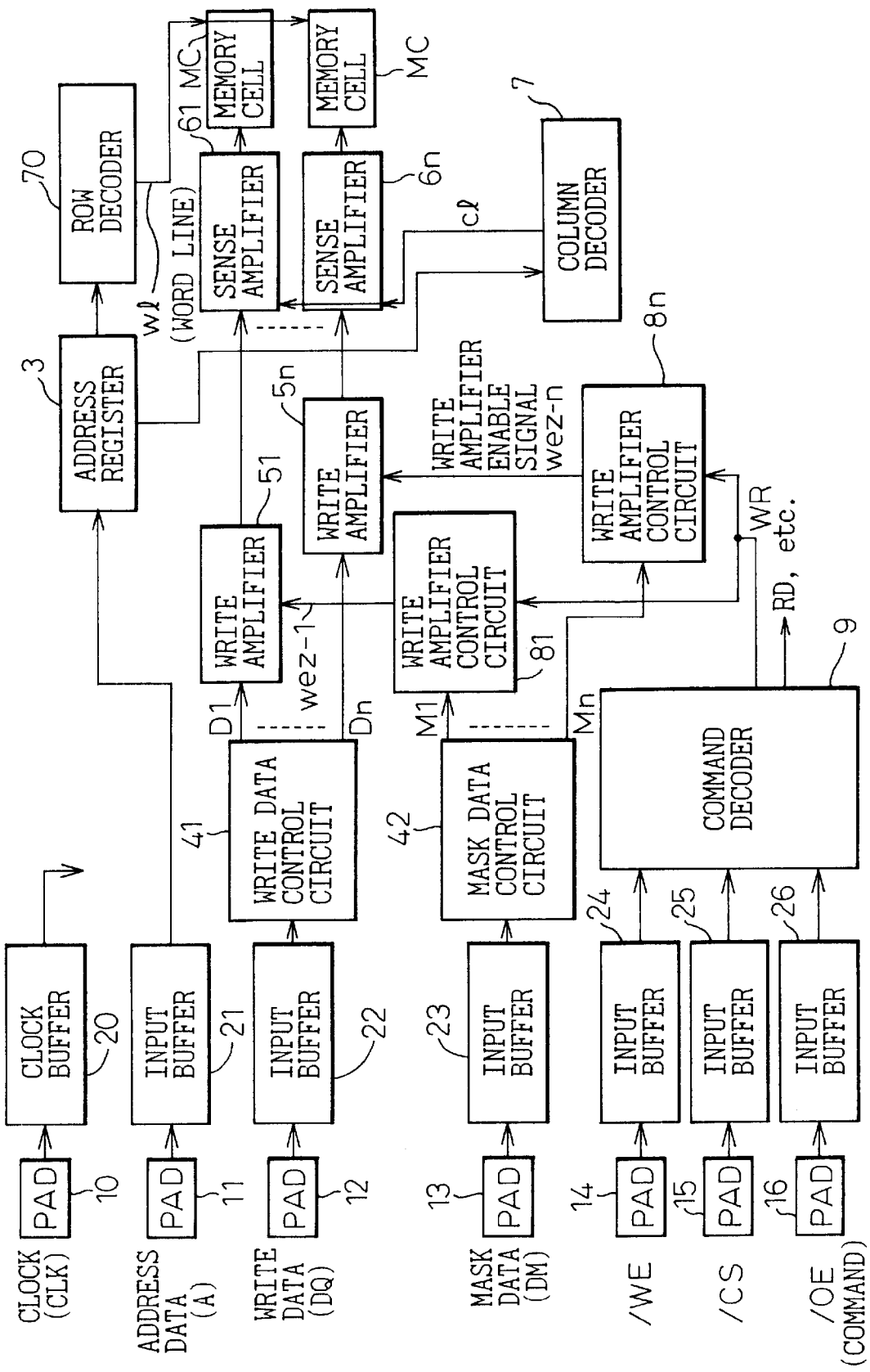
FIG. 1 is a block diagram schematically showing an example of a semiconductor memory device according to the related art.

FIG. 1 is a block diagram schematically showing an example of the semiconductor memory device according to the related art. In FIG. 1, reference numerals 10 to 16 designate input pads, numeral 20 a clock buffer, numerals 21 to 26 input buffers, numeral 3 an address register, numeral 41 a write data control circuit, numeral 42 a mask data control circuit, numerals 51 to 5n write amplifiers, and numerals 61 to 6n sense amplifiers. Also, reference numeral 7 designates a column decoder, numeral 70 a row decoder, numerals 81 to 8n write amplifier control circuits, and numeral 9 a command decoder.

The address data (A) is supplied through the pad 11 and the input buffer 21 to the address register 3 and input to the row decoder 70 and the column decoder 7, in which a word line (w1) and a column line (c1) corresponding to the address data are selected thereby to select a predetermined cell (MC) in the memory cell array. A plurality of cells corresponding to the burst length written simultaneously are selected by the word line and the column line.

The serial write data (DQ) are supplied to the write data control circuit 41 through the pad 12 and the input buffer 22 and, after serial-parallel conversion, parallel write data D1 to Dn are supplied to the write amplifiers 51 to 5n, respectively. In similar fashion, the serial mask data (DM) is supplied to the mask data control circuit 42 through the pad 13 and the input buffer 23 and, after serial-parallel conversion, parallel mask data M1 to Mn are supplied to the write amplifier control circuits 81 to 8n, respectively.

The write amplifier control circuits 81 to 8n are supplied with a signal (write signal) WR indicating the write mode constituting one of the outputs of the command decoder 9, so that write amplifier enable signals wez-1 to wez-n (wez) for activating the write amplifiers 51 to 5n are output at a predetermined timing in accordance with the mask information (M1 to Mn). The sense amplifiers 61 to 6n receive the signals (write data) from the corresponding activated write amplifiers 51 to 5n, respectively and, in accordance with the column line select signal c1 from the column decoder 7 (at the leading edge of c1), the write operation is carried out simultaneously into a plurality of cells (MC) selected by the word line w1) and the column line (c1). By the way, the masking process of predetermined bits of the burst length in the write operation is executed, for example, in order to use the same semiconductor memory device in various configurations meeting the demand of the user.

The command decoder 9 is supplied with a write enable signal (/WE), a chip select signal (/CS) and an output enable signal (/OE) through the input pads 14 to 16 and the input buffers 24 to 26 and, by decoding these command signals, outputs a write signal WR. Although the semiconductor memory device described above is a non-multiple address type for inputting all the addresses at a time, there is also available a multiple address type in which the address is input twice for RAS (row side) and CAS (column side). Also, the command decoder 9 outputs a signal (such as a read signal RD) for controlling the various operations in addition to the write signal WR. Further, the clock CLK is fetched through the input pad 10 and the clock buffer 20 and supplied to the various circuits of the semiconductor memory device.

Figures 2, 3:
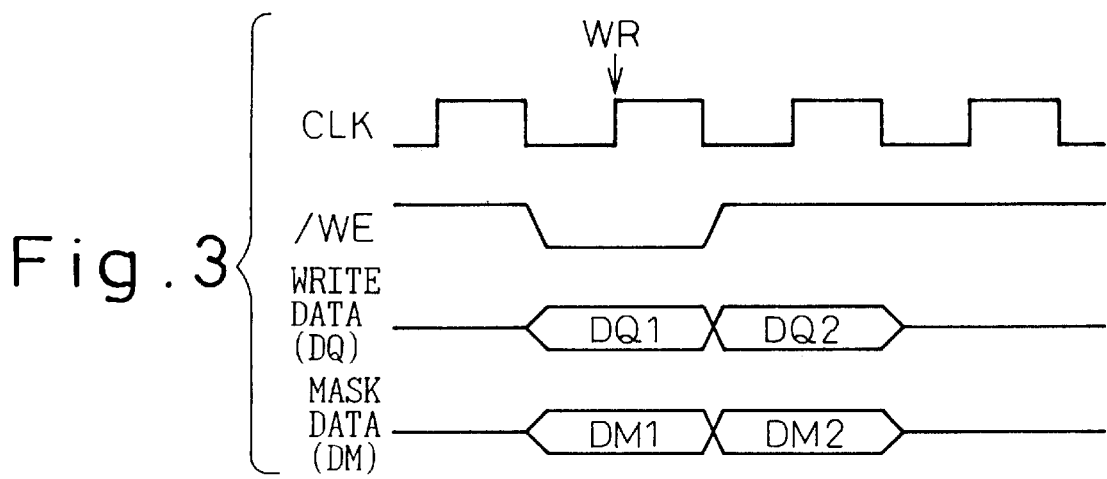
FIG. 2 is a diagram for explaining the masking process for the semiconductor memory device shown in FIG. 1.
FIG. 3 is a diagram for explaining the masking process for the semiconductor memory device shown in FIG. 1.

FIG. 2 is a diagram for explaining the masking process for the semiconductor memory device shown in FIG. 1. For simplifying the explanation, this refers to the case where the burst length is 2. In similar fashion, the description that follows also relates to the case in which the burst length is 2.

As shown in FIG. 2, in a semiconductor memory device according to the related art, shown in FIG. 1, having a burst length of 2, for example, 2-bit mask data DM1 and DM2 are supplied for the 2-bit write data DQ1 and DQ2, so that when the mask data at "H" level, the operation is masked while the write operation is carried out when the mask data is at "L" level. Specifically, in the case where the mask data DM1 and DM2 are both "L", the write data DQ1 and DQ2 are both written; in the case where the mask data DM1 and DM2 are "L" and "H", respectively, the write data DQ1 is written while the write data DQ2 is masked; and in the case where the mask data DM1 and DM2 are at "H" and "L" levels, respectively, the write data DQ1 is masked and the write data DQ2 is written. In the case where the mask data DM1 and DM2 are both "H", on the other hand, the write data DQ1 and DQ2 are both masked (not written). The last mode, therefore, need not be taken into account.

Figure 4:
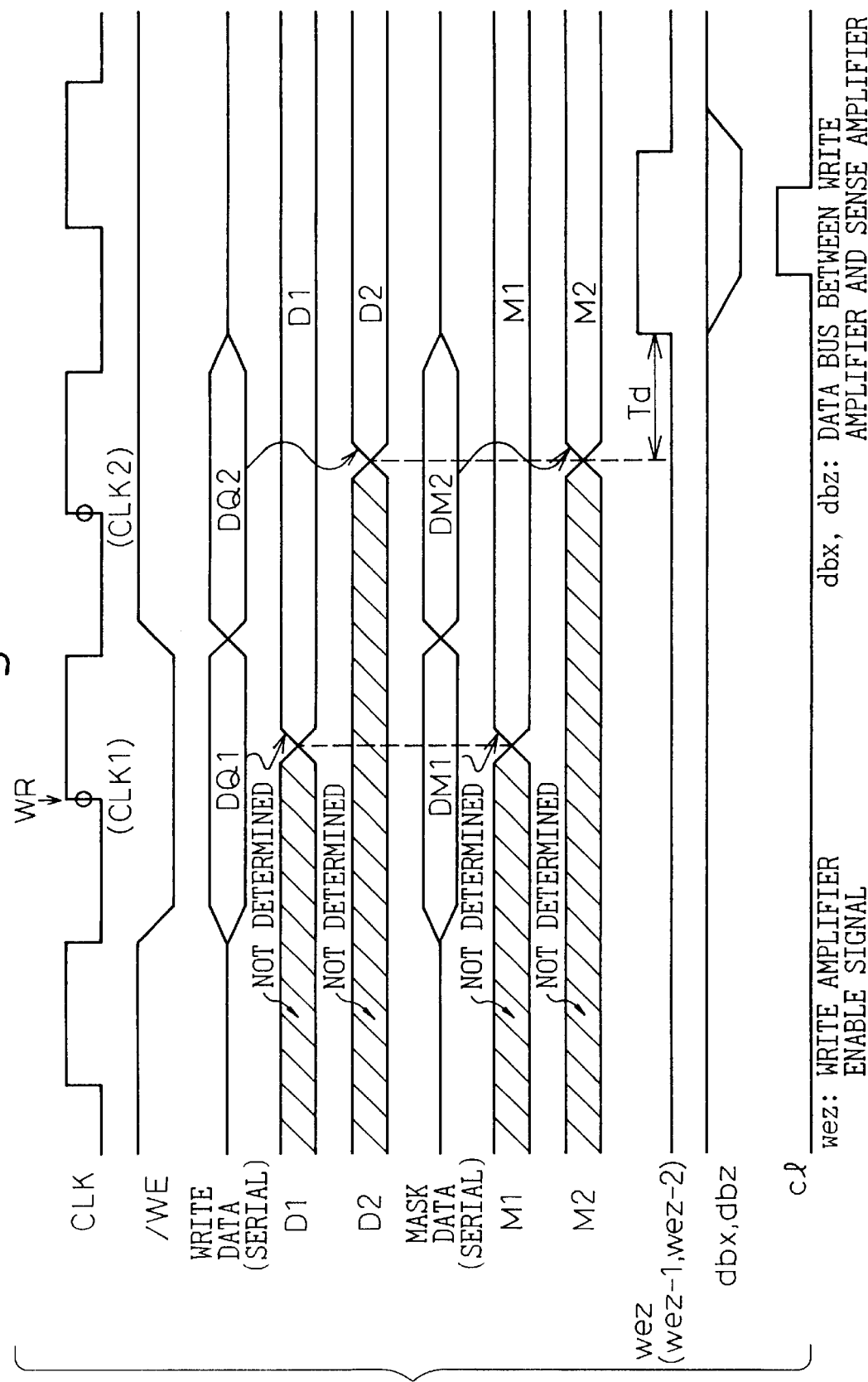
FIG. 4 is a timing chart for explaining the masking process for the semiconductor memory device shown in FIG. 1.

FIG. 3 is a diagram for explaining the masking process for the semiconductor memory device shown in FIG. 1. FIG. 4 is a timing chart for explaining the masking process for the semiconductor memory device shown in FIG. 1.

As shown in FIG. 3, the semiconductor memory device according to the related art of FIG. 1 is supplied with the serial write data DQ1, DQ2 and the corresponding serial mask data DM1, DM2 and is controlled by the write signal WR with the write enable signal /WE at "L" level.

As shown in FIG. 4, the serial write data DQ1, DQ2 are converted into parallel data by the write data control circuit 41 and supplied as parallel write data D1, D2 to the write amplifiers 51, 52. In a similar manner, the serial mask data DM1, DM2 are converted into parallel data by the mask data control circuit 42, and supplied as parallel mask data M1, M2 to the write amplifier control circuits 81, 82. Specifically, in the semiconductor memory device according to the related art shown in FIG. 1, the serial write data DQ1 and the mask data DM1 are fetched at the timing of a first clock CLK (first-bit fetch clock CLK1), so that the write data D1 and the mask data M1 in parallel are output at the same time. Further, the write data DQ2 and the mask data DM2 in series are fetched at the timing of the next clock CLK (second-bit fetch clock CLK 2) so that the write data D2 and the mask data M2 in parallel are output at the same time.

Thus, the write amplifier control circuits 81, 82 are required to output the write amplifier enable signal wez only after the second-bit mask data M2 (parallel). Specifically, the write amplifier enable signal wez (wez-1, wez-2) supplied to the write amplifiers 51, 52 is output at a timing a time Td behind the output of the second-bit write data (parallel) D2. The time (period) Td is the length of time after the output of the second-bit mask data M2 to the output of the write amplifier enable signal wez.

As shown in FIG. 4, the data buses dbx, dbz between the write amplifiers 51, 52 and the sense amplifiers 61, 62 are precharged with a source voltage, so that when the write amplifier enable signal wez rises to high level H and the data is output to the data buses dbx, dbz, one of the data buses dbx and dbz falls to low level L. After the data are output to the data buses dbx, dbz, the column line select signal C1 rises, so that the data are written into the cell MC through the sense amplifiers 61, 62.

In this way, in the semiconductor memory device according to the related art, the write amplifier enable signal wez is output at a timing the time Td after establishment of the second-bit mask data M2, and therefore the write operation is delayed. The read operation, on the other hand, poses no problem of the delay which is caused by the masking process in the write operation. Thus, in the semiconductor memory device according to the related art, the core operation is delayed at the time of write operation as compared with at the time of read operation, and therefore, some time is required before the next command is issued, resulting in the problem of a lower data transfer rate.

Now, the semiconductor memory device according to each embodiment of the invention will be described in detail below with reference to the drawings.

Figure 5:
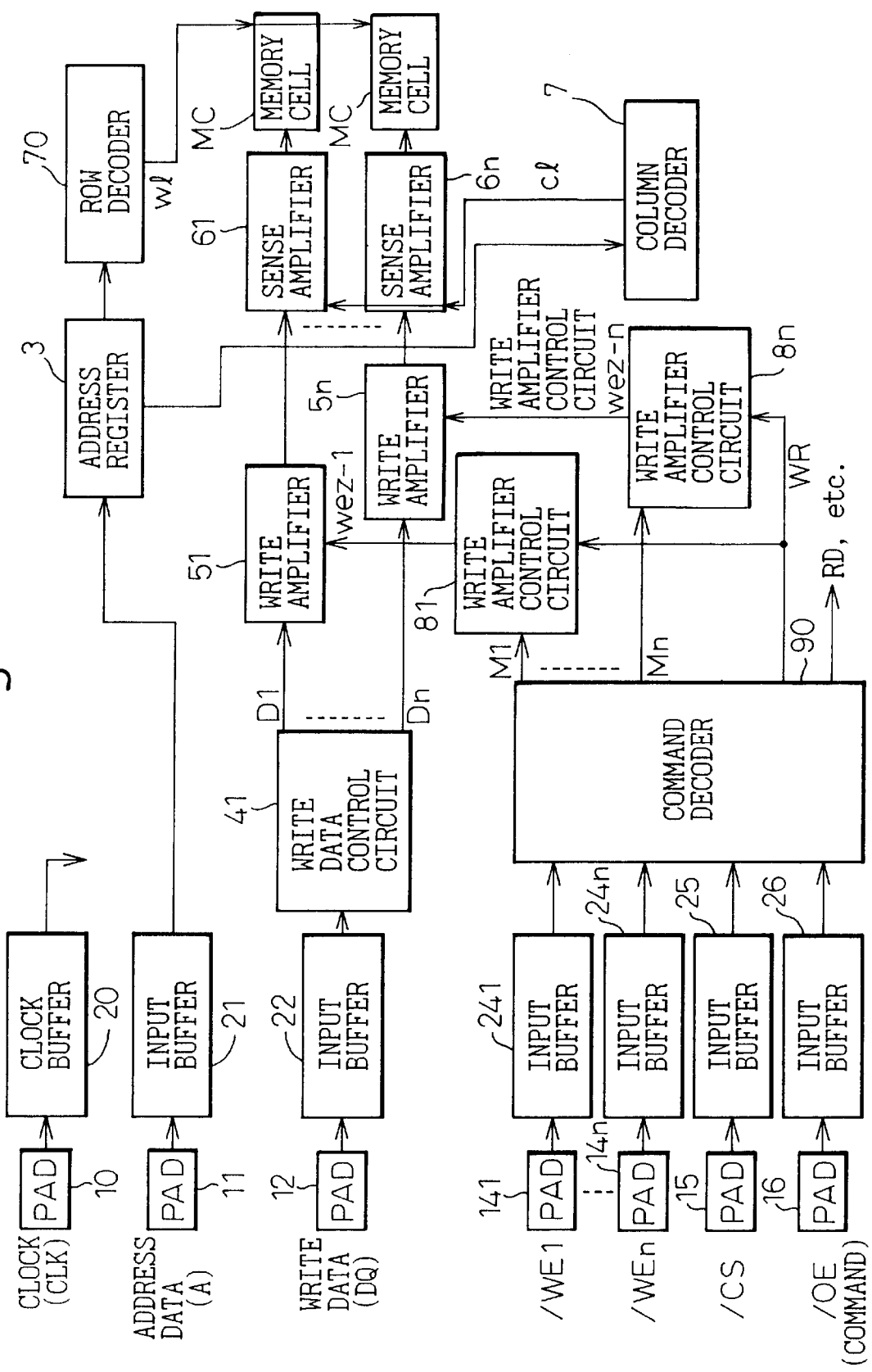
FIG. 5 is a block diagram showing a semiconductor memory device according to a first embodiment of the present invention.

FIG. 5 is a block diagram showing a semiconductor memory device according to a first embodiment of the invention. In FIG. 5, reference numerals 10 to 12, 141 to 14n and 15, 16 designate input pads, numeral 20 a clock buffer, numerals 21 to 22, 241 to 24n and 25, 26 input buffers, numeral 3 an address register, numeral 41 a write data control circuit, numerals 51 to 5n write amplifiers, and numerals 61 to 6n sense amplifiers. Also, reference numeral 7 designates a column decoder, numeral 70 a row decoder, numerals 81 to 8n write amplifier control circuits, and numeral 90 a command decoder.

The address data A is supplied to the address register 3 through the pad 11 and the input buffer 21 and is input to the row decoder 70 and the column decoder 7. The row decoder 70 and the column decoder 7 select the word line w1 and the column line c1 corresponding to the address data and thus select a predetermined cell MC in the memory cell array. A plurality of cells corresponding to the burst length written at the same time are selected by the word line and the column line.

The serial write data DQ is supplied to the write data control circuit 41 through the pad 12 and the input buffer 22, and converted from serial to parallel data, so that the parallel write data D1 to Dn are supplied to the write amplifiers 51 to 5n, respectively.

The write amplifier control circuits 81 to 8n are supplied with the parallel mask data M1 to Mn output from the command decoder 90 and the signals (write signals) WR indicating the write mode, and in accordance with the mask information M1 to Mn, output the write enable signals wez-1 to wez-n (wez) for activating the write amplifiers 51 to 5n at a predetermined timing. The sensor amplifiers 61 to 6n receive the signals (write data) from the corresponding write amplifiers 51 to 5n thus activated, and perform the write operation at the same time into a plurality of the cells MC selected by the word line w1 and the column line c1 in response to the column line select signal c1 (at the leading edge of the signal c1) from the column decoder 7.

The command decoder 90 is supplied with a plurality of write enable signals (/WE1 to /WEn) through the input pads 141 to 14n on the one hand and supplied with the chip select signal /CS and the output enable signal /OE through the input buffers 25, 26 on the other hand. These command signals are decoded thereby to output the mask data M1 to Mn and the write signal WR. Although the semiconductor memory device described above is of non-multiple address type in which all the addresses are input at a time, there is available a multiple address type in which the address is input twice for RAS (row side) and CAS (column side). Also, the command decoder 90 outputs signals (such as a read signal RD) for controlling the various operations in addition to the write signal WR. Further, the clock CLK is fetched through the input pad 10 and the clock buffer 20, and supplied to the various circuits of the semiconductor memory device.

In this way, in the semiconductor memory device according to the first embodiment, a single write enable signal /WE in the semiconductor memory device according to the related art shown in FIG. 1 is replaced by a plurality of write enable signals /WE1 to /WEn, while at the same time omitting the mask data DM and the mask data control circuit 42. Specifically, according to this embodiment, the write enable signals in the number corresponding to the burst length n are prepared, and input to the command decoder 90. The command decoder 90, in accordance with the combination of the write enable signals /WE1 to /WEn, outputs the write signal WR and the mask signals M1 to Mn at the time of the write operation, and the read signal RD at the time of the read operation.

Figures 6, 7:
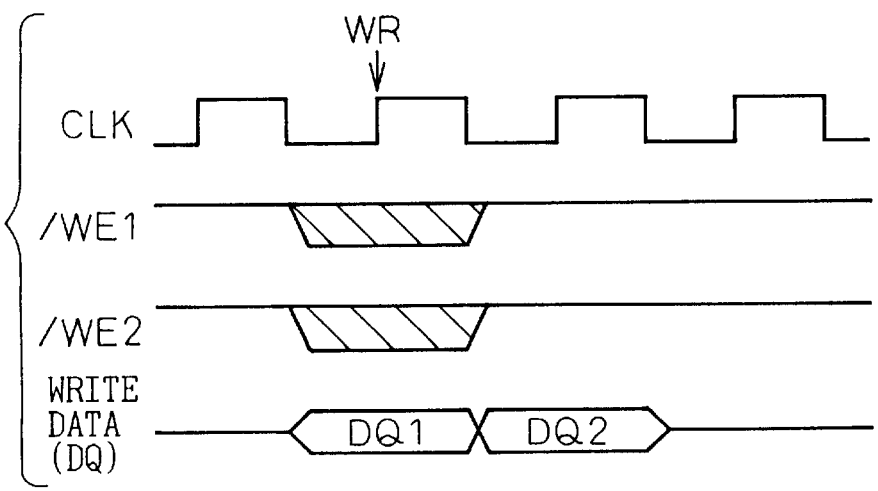
FIG. 6 is a diagram for explaining the masking process for the semiconductor memory device shown in FIG. 5.
FIG. 7 is a diagram for explaining the masking process for the semiconductor memory device shown in FIG. 5.

FIG. 6 is a diagram for explaining the masking process for the semiconductor memory device shown in FIG. 5. For simplifying the explanation, a burst length of 2 is assumed. Similarly, the description that follows relates to the case where the burst length is 2.

As shown in FIG. 6, with the semiconductor memory device according to the first embodiment having a burst length of 2, for example, two-bit write enable signals /WE1, /WE2 are supplied in parallel for two-bit serial write data DQ1, DQ2, so that when the write enable signal is at high level "H", the data is masked while when the write enable signal is at low level "L", the data is written. Specifically, when the write enable signals /WE1, /WE2 are both "L", the two-bit write data DQ1, DQ2 are both written as in the normal write operation. Also, when the write enable signals /WE1, /WE2 are "L" and "H", respectively, the first-bit data DQ1 is written while the second-bit data DQ2 is masked. In the case where the write enable signals /WE1, /WE2 are at "H" and "L", respectively, the first-bit data DQ1 is masked while the second-bit data DQ2 is written. In the case where the write enable signals /WE1, /WE2 are both "H", on the other hand, the write data DQ1, DQ2 are both masked. As long as the write enable signal remains at "H", however, the write operation is not performed. In the case where the burst length is other than 2 (BL=2), on the other hand, a similar masking process can be executed by increasing the number of the write enable signals. Further, depending on the configuration of the semiconductor memory device, a command signal other than the write enable signal can be used.

Figure 8:
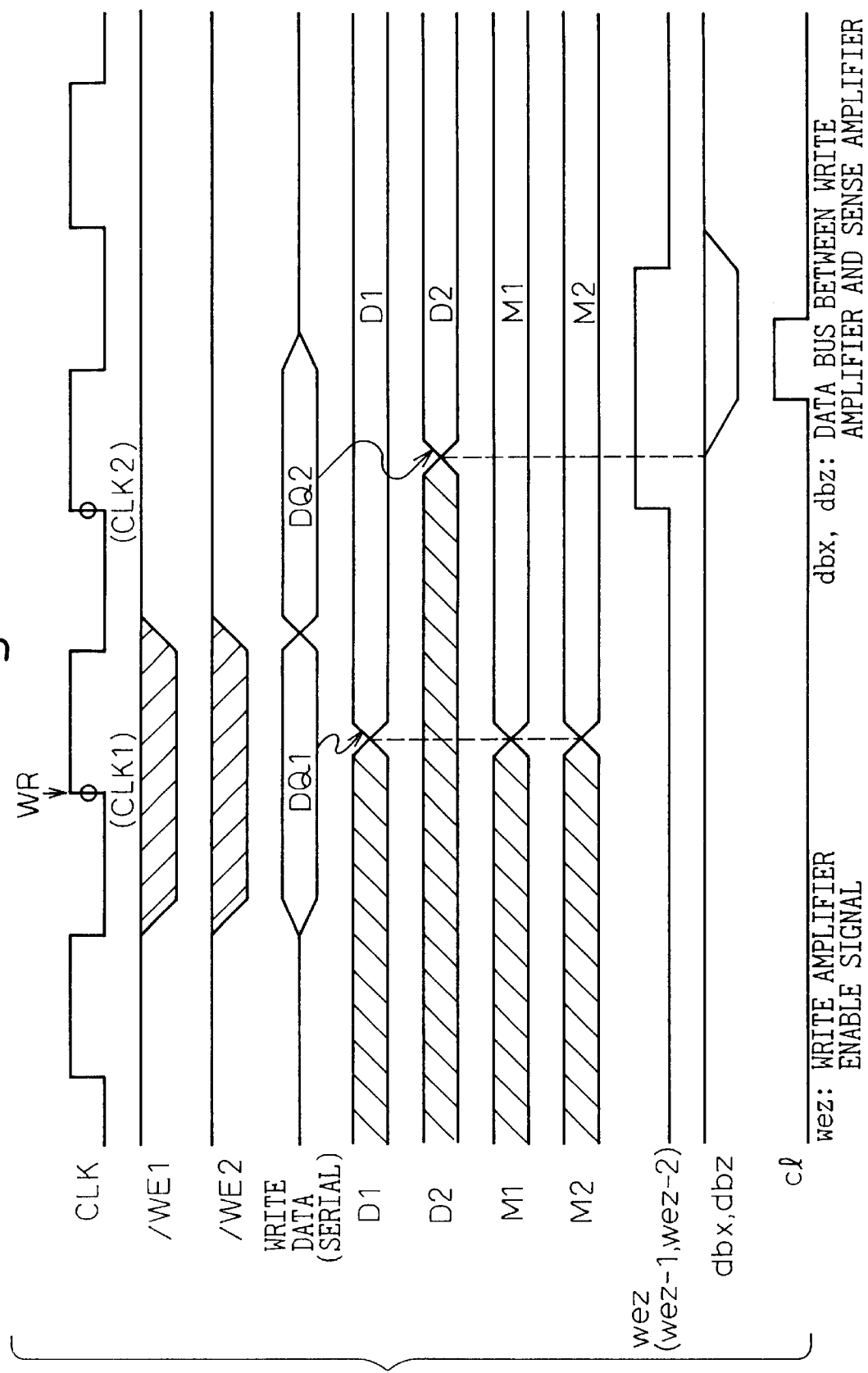
FIG. 8 is a timing chart for explaining the masking process for the semiconductor memory device shown in FIG. 5.

FIG. 7 is a diagram for explaining the masking process for the semiconductor memory device shown in FIG. 5. FIG. 8 is a timing chart for explaining the masking process for the semiconductor memory device shown in FIG. 5.

As shown in FIG. 7, in the semiconductor memory device according to the first embodiment, the serial input write data DQ1, DQ2 with the corresponding parallel write enable signals /WE1, /WE2 are input. In the case where the write mode is entered by the write signal WR with one of the write enable signals at low level L, the mask data M1, M2 are established by the parallel 2-bit write enable signals /WE1, /WE2 indicating the mask information before the second-bit serial write data DQ2 is fetched.

As shown in FIG. 8, the serial write data DQ1, DQ2 are converted into parallel data and supplied as parallel write data D1, D2 to the write amplifiers 51, 52 by the write data control circuit 41. The parallel mask data M1, M2, on the other hand, are generated by the write enable signals /WE1, /WE2 and supplied to the write amplifier control circuits 81, 82. Specifically, as in the semiconductor memory device according to the related art described above, the serial write data DQ1 is fetched and the parallel write data D1 is output at the timing of the first clock CLK (first-bit clock CLK1 fetched). Further, at the timing of the next clock CLK (second-bit clock CLK2 fetched), the serial write data DQ2 is fetched and the parallel write data D2 is output.

In the semiconductor memory device according to the first embodiment, however, the mask data M1, M2 are determined by the write enable signals /WE1, /WE2 corresponding to the first-bit serial write data DQ1. Therefore, the mask data M1, M2 are output at substantially the same timing as the first-bit parallel write data D1, and by the timing when the second-bit parallel write data D2 is output, the write amplifier enable signal wez (wez-1, wez-2) from each write amplifier control circuit 81, 82 can be supplied to the write amplifiers 51, 52. Thus, the time length Td shown in FIG. 4 (the time length from the output of the second-bit mask data M2 to the output of the write amplifier enable signal wez) is eliminated, thereby making it possible to improve the data transfer rate by increasing the speed of the masking process in burst write mode.

As shown in FIG. 8, in the semiconductor memory device according to the first embodiment, as in the related art described above, the data buses dbx, dbz between the write amplifiers 51, 52 and the sense amplifiers 61, 62 are precharged with a source voltage. When the write amplifier enable signal wez rises to high level "H" and the data are output to the data buses dbx, dbz, one of the data buses dbx, dbz is reduced to "L" level. After the data are output to the data buses dbx, dbz, the column line select signal C1 is raised thereby to write the data into the cell MC through the sense amplifiers 61, 62.

As described above, according to this embodiment, in the case where the serially input data are written into a cell in the form of several bits in parallel, the timing of the core operation can be advanced in view of the fact that the mask data M1, M2 are input earlier than the write data D1, D2 (earlier than the second-bit write data D2), thereby making it possible to improve the data transfer rate. This and subsequent embodiments refer mainly to the case in which the burst length is 2. Nevertheless, the same applies to burst lengths of other than 2.

Figure 9:
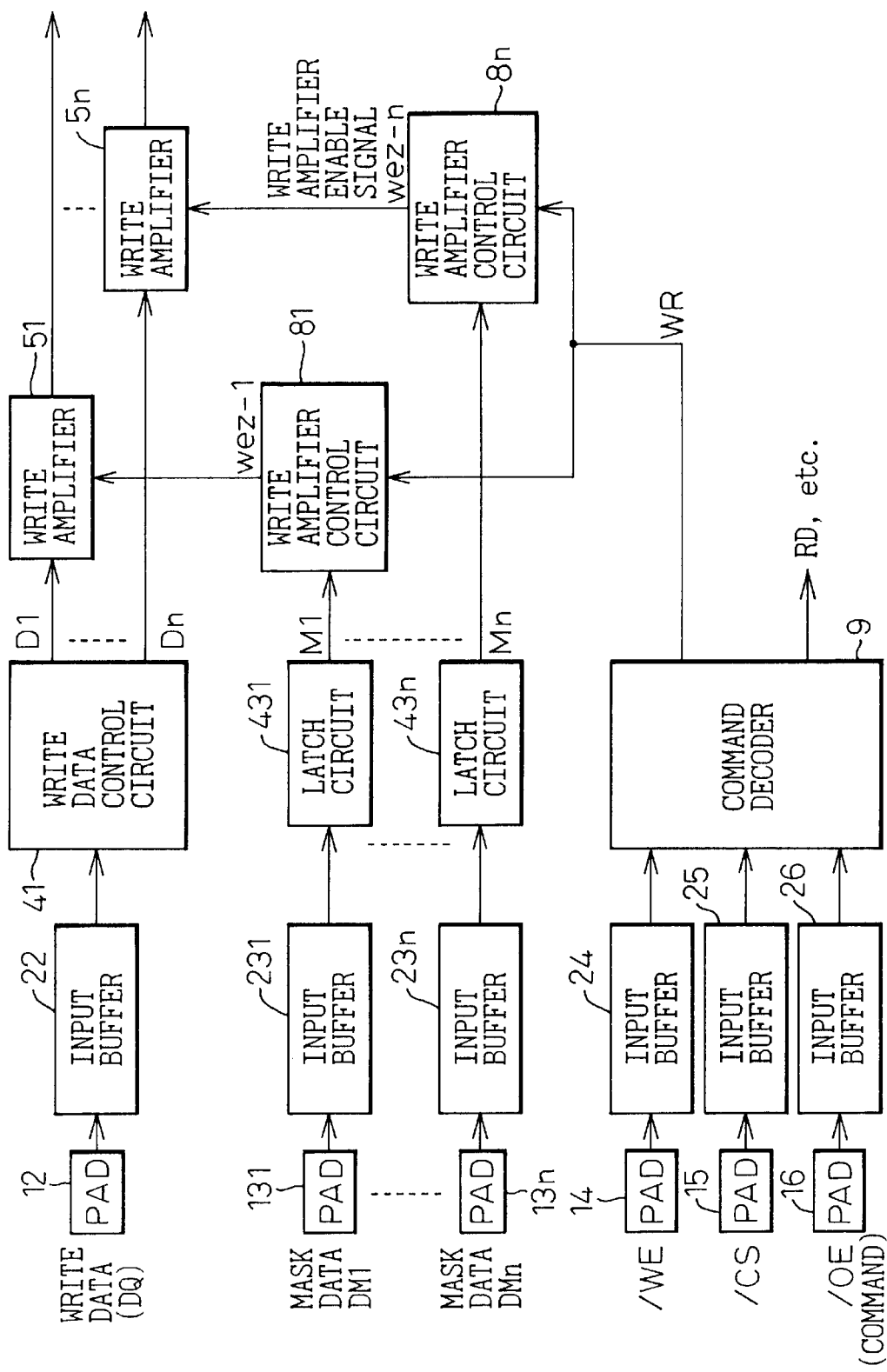
FIG. 9 is a block diagram showing a semiconductor memory device according to a second embodiment of the present invention.

FIG. 9 is a block diagram showing a semiconductor memory device according to a second embodiment of the invention. In FIG. 9, reference numerals 131 to 13n designate input pads, numerals 231 to 23n input buffers and numerals 431 to 43n latch circuits. In FIG. 8, the same component parts as the corresponding ones in the first embodiment shown in FIG. 5 are designated by the same reference numerals, respectively. Also, the component parts not directly related to the second embodiment such as the sense amplifier and the address register are not shown for simplicity's sake, and actually have substantially the same configuration as the corresponding parts of the first embodiment shown in FIG. 1.

As is clear from a comparison between FIGS. 9, 5 and FIG. 1, in the semiconductor memory device according to the second embodiment, unlike the first embodiment of FIG. 5, a single write enable signal /WE, but not a plurality of the write enable signals /WE1 to /WEn, is supplied to the command decoder as in the related art shown in FIG. 1. In addition, a plurality of the pads 131 to 13n are used for supplying the mask data DM1 to DMn, so that the mask data DM1 to DMn in the number corresponding to the write data are input in parallel. Specifically, the mask data DM1 to DMn are supplied in parallel, from the pads 131 to 13n, to the corresponding latch circuits 431 to 43n through the input buffers 231 to 23n, respectively, and the mask data M1 to Mn are supplied from the latch circuits 431 to 43n to the corresponding write amplifier control circuits 81 to 8n, respectively.

Specifically, according to the second embodiment, the mask data DM1 to DMn input in parallel from an external source are prepared in the number corresponding to the burst length n. In such a case, the mask data (mask signals) DM1 to DMn are not controlled in a special way, but are latched until the end of the write operation.

Figures 10, 11:
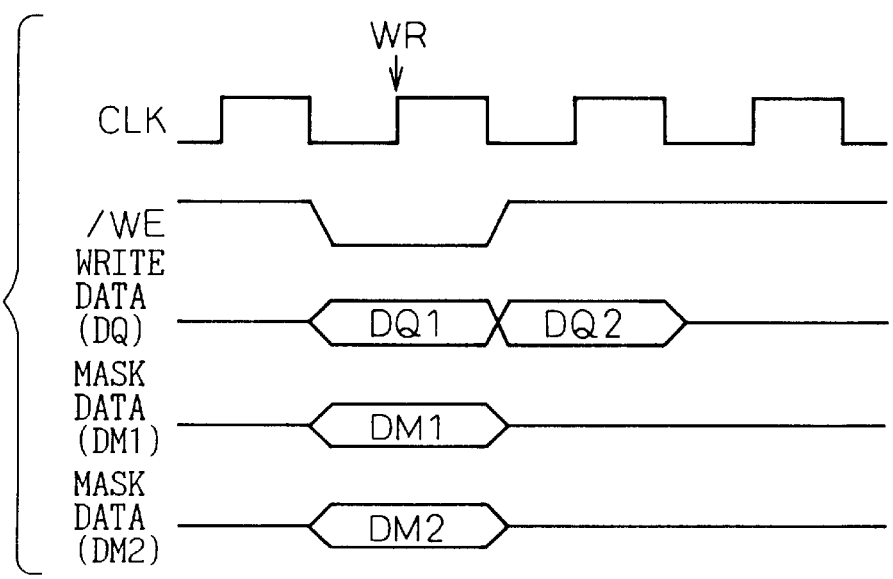
FIG. 10 is a diagram for explaining the masking process for the semiconductor memory device shown in FIG. 9.
FIG. 11 is a diagram for explaining the masking process for the semiconductor memory device shown in FIG. 9.

FIG. 10 is a diagram for explaining the masking process for the semiconductor memory device shown in FIG. 9, in which the burst length is 2.

As shown in FIG. 10, in the semiconductor memory device according to the second embodiment, parallel two-bit mask data DM1, DM2 and corresponding serial two-bit write data DQ1, DQ2 are supplied and masked when the mask data DM1, DM2 are high at "H" while, when the mask data are low at "L", the write operation is performed. Specifically, in the case where the mask data DM1, DM2 input in parallel through the pads 131, 132 are both "L", the write data DQ1, DQ2 are both written, while when the mask data DM1, DM2 are "L", "H", respectively, the write data DQ1 is written whereas the write data DQ2 is masked. Also, when the mask data DM1, DM2 are "H", "L", respectively, the write data DQ1 is masked whereas the write data DQ2 is written. In the case where the burst length is other than 2, the number of mask data input are increased correspondingly.

Figure 12:
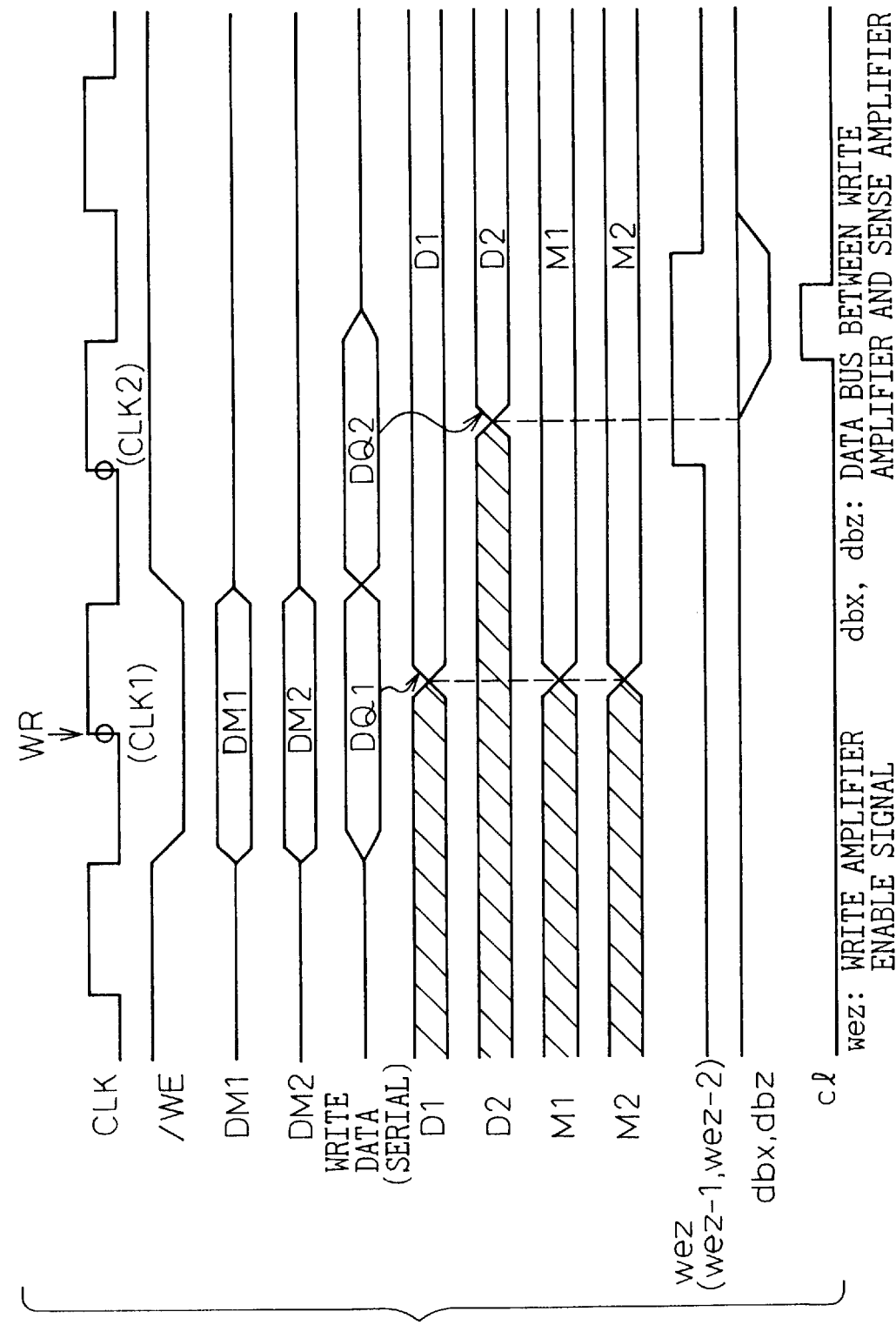
FIG. 12 is a timing chart for explaining the masking process for the semiconductor memory device shown in FIG. 9.

FIG. 11 is a diagram for explaining the masking process for the semiconductor memory device shown in FIG. 9. FIG. 12 is a timing chart for explaining the masking process in the semiconductor memory device shown in FIG. 9.

As shown in FIG. 11, in the semiconductor memory device according to the second embodiment, the write data DQ1, DQ2 are serially input while the corresponding mask data DM1, DM2 are input in parallel. When the write mode is started by the write signal WR with the write enable signal /WE at "L", the mask data M1, M2 are determined as they are by the two-bit parallel mask data DM1, DM2 indicating the mask information before fetching the second-bit serial write data DQ2.

As is clear from the comparison between FIG. 12 and FIG. 8, the mask data DM1, DM2 according to the second embodiment correspond to the write enable signals /WE1, /WE2 in the first embodiment (although the write enable control operation is performed by the write enable signal /WE in the second embodiment). Thus, the mask data M1, M2 are output at substantially the same timing as, say, the first-bit parallel write data D1, and therefore the write amplifier enable signal wez (wez-1, wez-2) can be applied to the write amplifiers 51, 52 from the write amplifier control circuits 81, 82, respectively, by the timing when the second-bit parallel write data D2 is output. As a result, as in the first embodiment, the masking process in burst write mode is increased in speed thereby making it possible to improve the data transfer rate.

Figure 13:
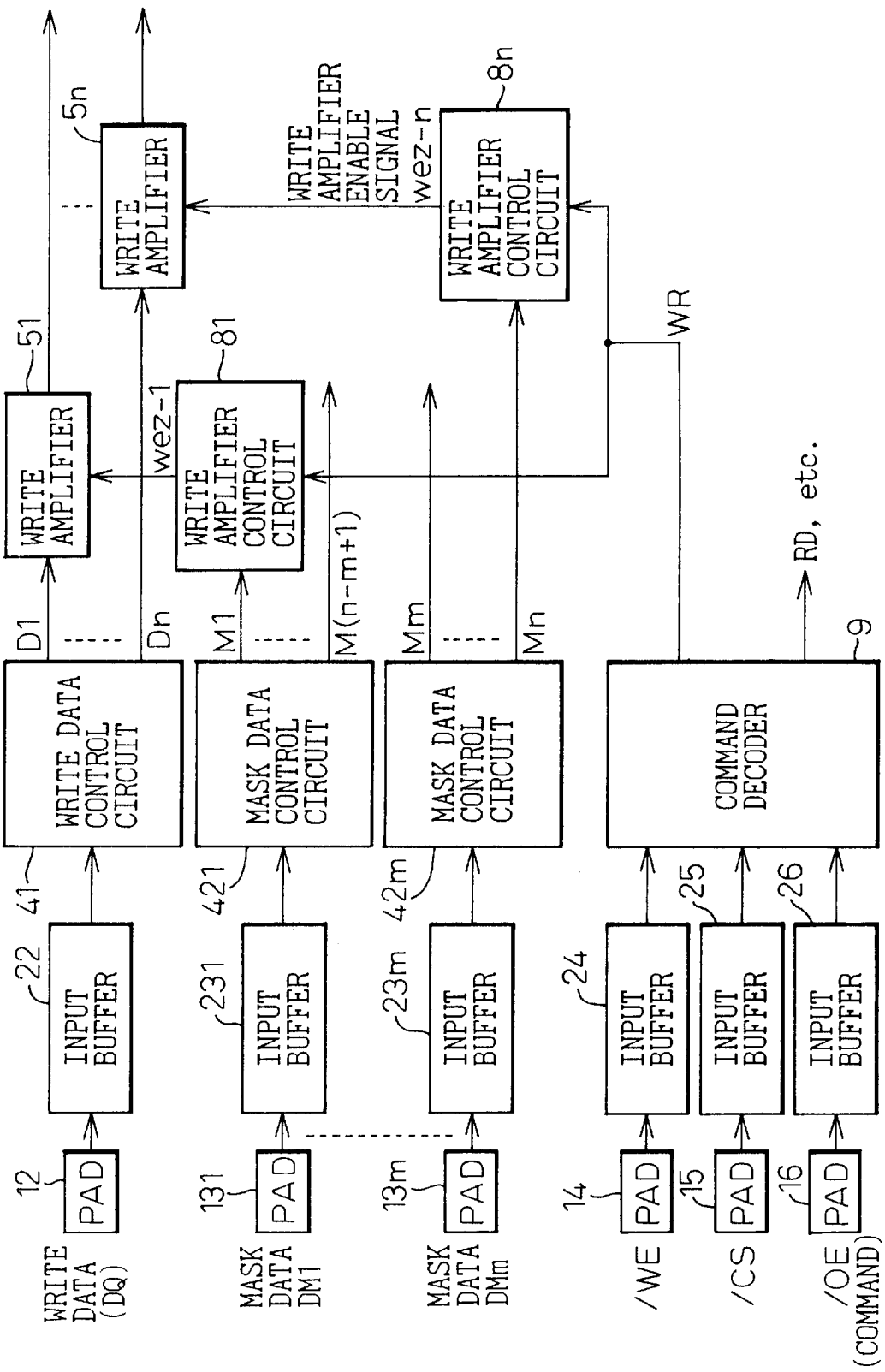
FIG. 13 is a block diagram showing a semiconductor memory device according to a third embodiment of the present invention.

FIG. 13 is a block diagram showing a semiconductor memory device according to a third embodiment of the invention. In FIG. 13, reference numerals 131 to 13m designate input pads, numerals 231 to 23m input buffers, and numerals 421 to 42m mask data control circuits. Also, in this embodiment, the sense amplifiers and the address register are not included to simplify the explanation.

As seen from the comparison between FIG. 13 and FIG. 9, in the semiconductor memory device according to the third embodiment, the number of bits (m) of the mask data DM1 to DMm input from an external source is smaller than the number of bits (n) for the burst length so that the number of pads for inputting the mask data DM1 to DMm is reduced. Specifically, the masking process is executed with a plurality of bits of write data associated with a single mask data pad. This can reduce the number of pins used for the mask data especially in the case where the burst length BL is long. The m mask data DM1 to DMm are converted into the parallel mask data M1 to Mn in the number corresponding to the burst length in the mask data control circuits 421 to 42m, respectively.

Figure 14:
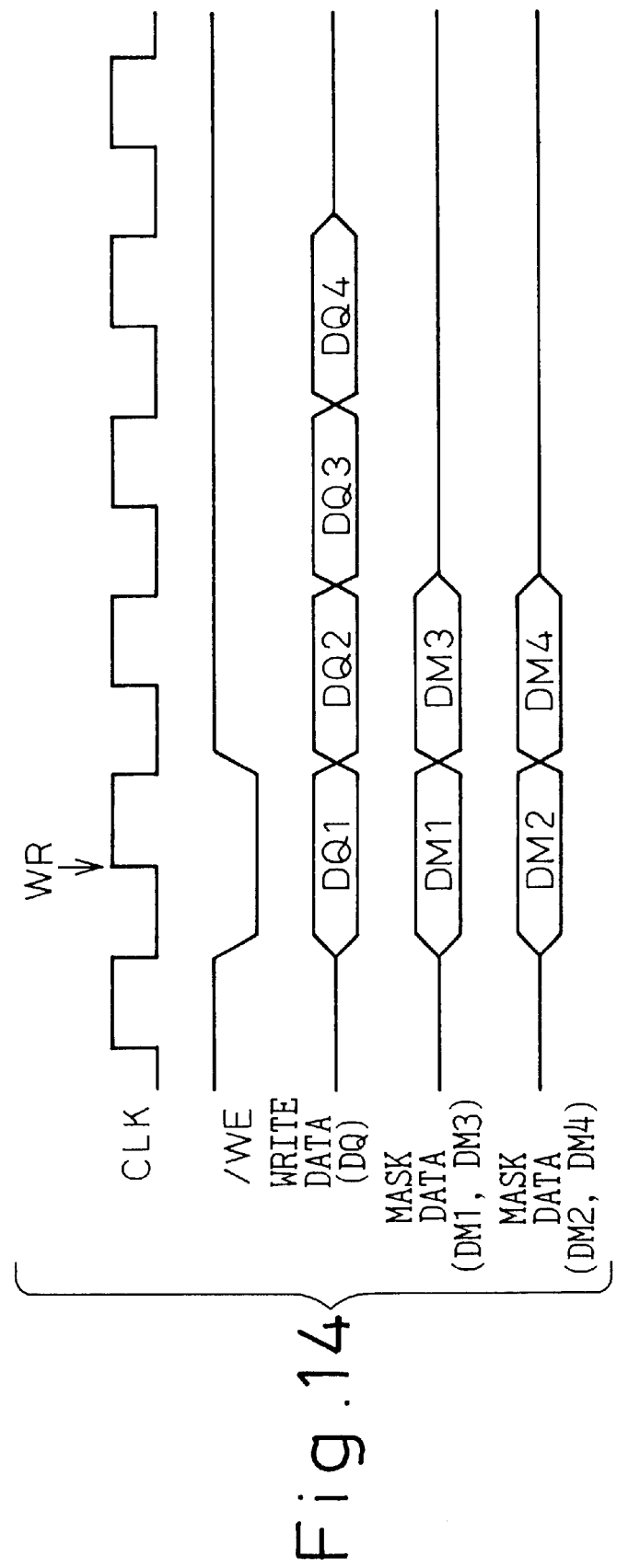
FIG. 14 is a diagram for explaining the masking process for the semiconductor memory device shown in FIG. 13.
Figure 15:
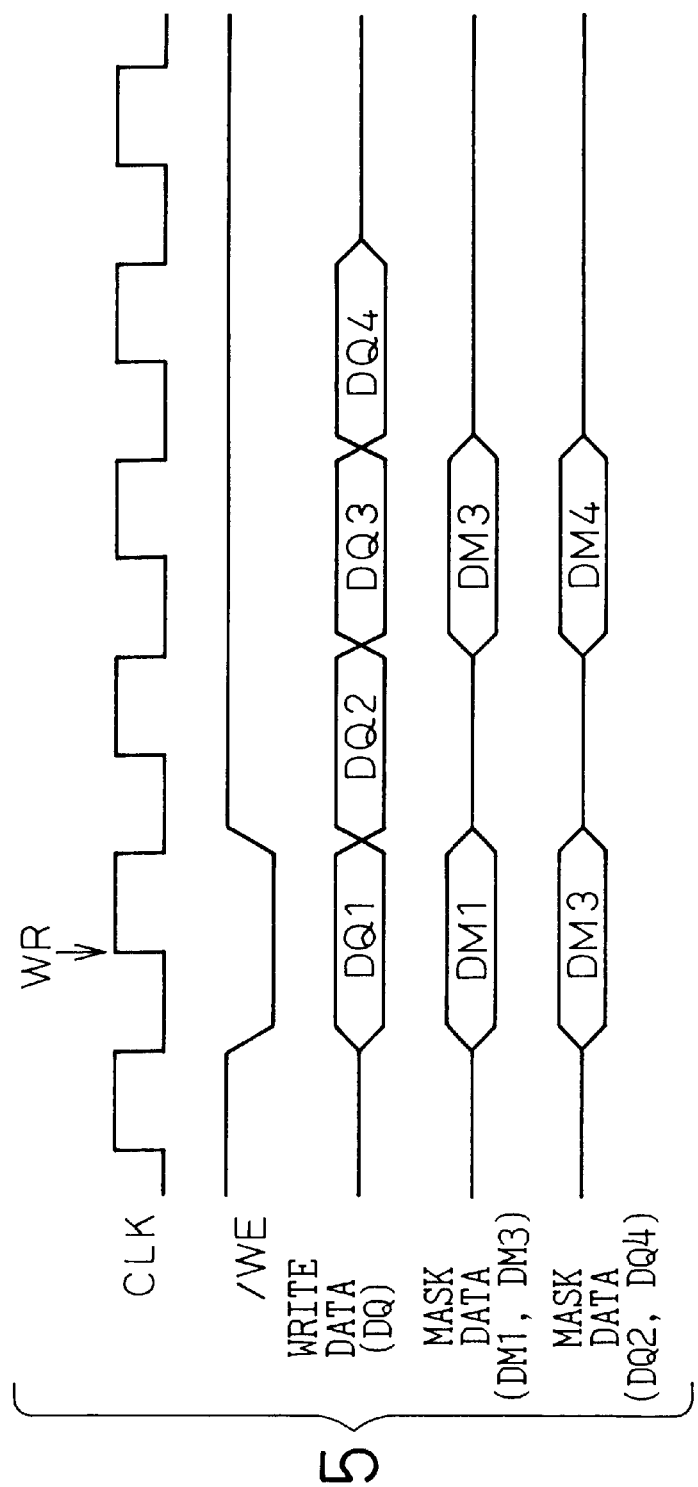
FIG. 15 is a diagram for explaining the masking process for a modification of the semiconductor memory device shown in FIG. 13.

FIG. 14 is a diagram for explaining the masking process in the semiconductor memory device shown in FIG. 13, and FIG. 15 is a diagram for explaining the masking process in a modification of the semiconductor memory device shown in FIG. 13. An explanation will be given below of the case involving the burst length of 4 with reference to FIGS. 14 and 15.

As shown in FIG. 14, in the semiconductor memory device according to the third embodiment, the mask data DM1 is input to the first pad 131 and the mask data DM2 to the second pad 132 at the same time as the first-bit write data DQ1 among the serially input write data DQ1 to DQ4. Further, the mask data DM3 is input to the first pad 131 and the mask data DM4 to the second pad 132 at the same time as the second-bit write data DQ2. As a result, before the third-bit write data DQ3 having a burst length of 4 is output (of course, before the fourth-bit write data DQ4 is output), the mask data M1 to M4 can be established, thereby making it possible to output the write amplifier enable signal wez (wez-1 to wez-4) to the write amplifier control circuits 81 to 84.

As shown in FIG. 15, in a modification of the third embodiment, the mask data DM1 is input to the first pad 131 and the mask data DM2 is input to the second pad 132 as the same time as the first-bit write data DQ1, for example, among the serially input write data DQ1 to DQ4. Further, the mask data DM3 is input to the first pad 131 and the mask data DM4 to the second pad 132 at the same time as the third-bit write data DQ3. As a result, the mask data M1 to M4 are established before the fourth-bit write data DQ4 having a burst length of 4 is output, thereby making it possible to output the write amplifier enable signal wez (wez-1 to wez-4) to the write amplifier control circuits 81 to 84.

The foregoing description refers to an application of the invention to a semiconductor memory device of non-multiple address type in which all the addresses are input at once. The present invention, however, is not limited to the semiconductor memory device of non-multiple address type but also to the semiconductor memory device of multiple address type in which the addresses are input in two parts including RAS (row side) and CAS (column side).

Figure 16:
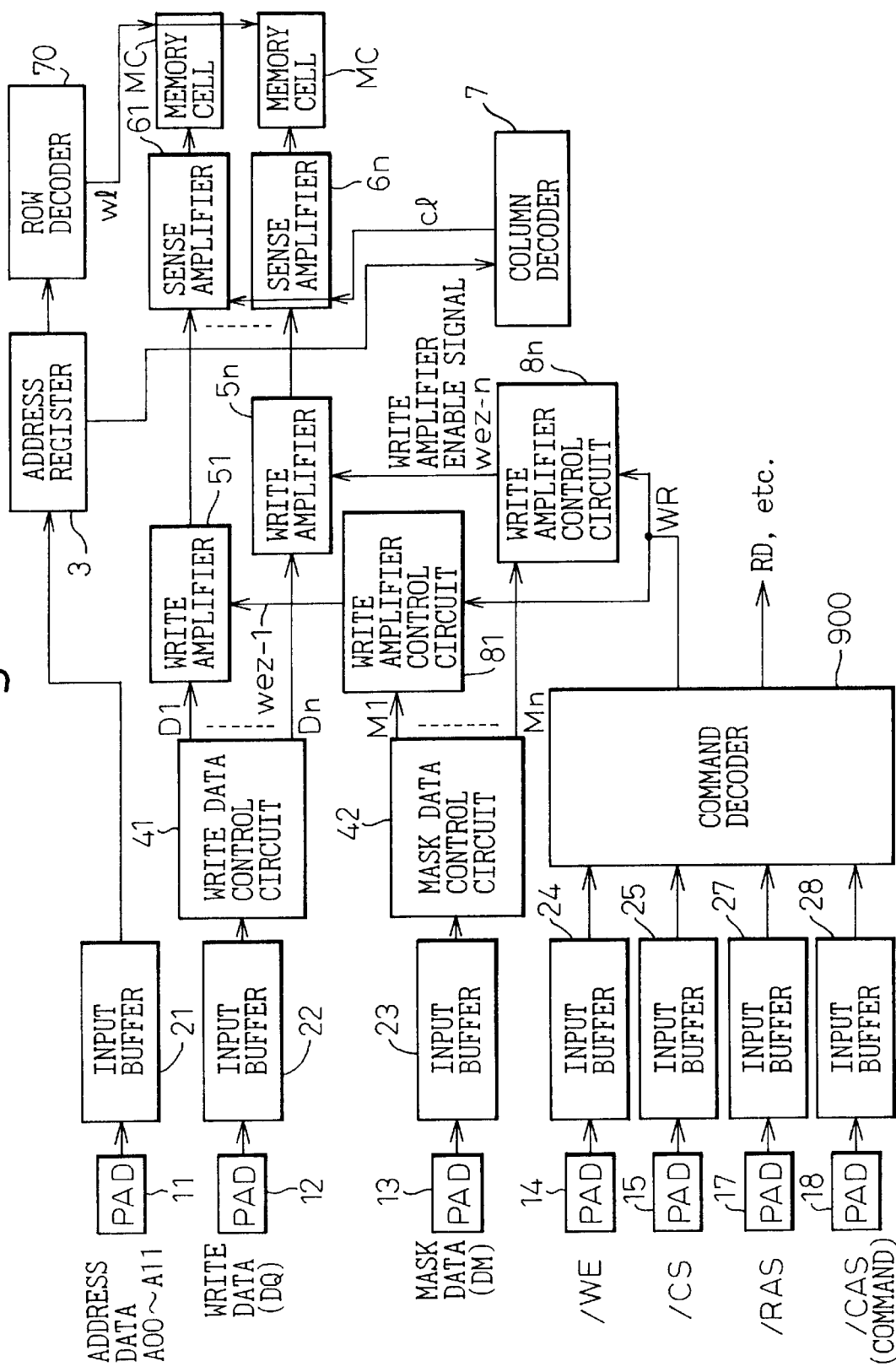
FIG. 16 is a block diagram schematically showing another example of the semiconductor memory device according to the related art.
Figure 17:
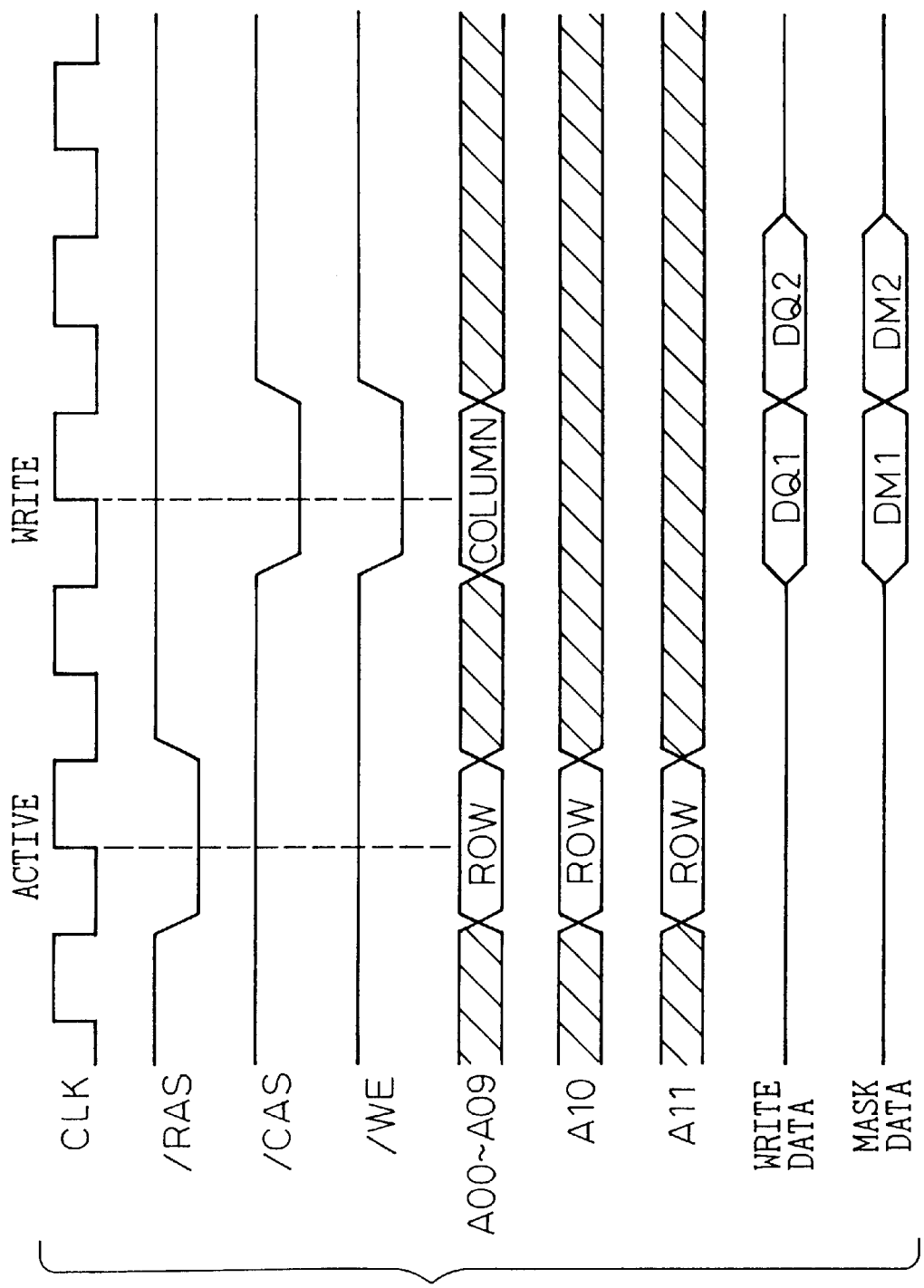
FIG. 17 is a timing chart for explaining the masking process for the semiconductor memory device shown in FIG. 16.

FIG. 16 is a block diagram schematically showing another example of the semiconductor memory device (the semiconductor memory device of multiple address type) according to the related art. FIG. 17 is a timing chart for explaining the masking process for the semiconductor memory device of FIG. 16. An explanation will be given with reference to FIGS. 16 and 17, in which the address data are assumed to be 12 bits of A00 to A11, including 12 row addresses (12 bits of A00 to A11) and 10 column addresses (10 bits of A00 to A09).

In FIG. 16, reference numerals 11 to 15, 16, 17 designate input pads, numerals 21 to 25, 26, 27 input buffers, numeral 3 an address register, numeral 41 a write data control circuit, numeral 42 a mask data control circuit, numerals 51 to 5n write amplifiers, and numerals 61 to 6n sense amplifiers. Also, reference numeral 7 designates a column decoder, numeral 70 a row decoder, numerals 81 to 8n write amplifier control circuits, and numeral 900 a command decoder. The address data A00 to A11 are each assigned a pad and an input buffer which are not shown for simplifying the explanation. Nor are the sense amplifiers or the address register are shown for the same reason.

As shown in FIGS. 16 and 17, in the semiconductor memory device of multiple address type, the row address strobe signal /RAS is reduced to "L" so that the row address is input, while the word line is turned on to activate the sense amplifier. Then, the column address strobe signal /CAS is reduced to "L" so that the column address is input. The first-bit write data DQ1 is input at the same time as the column address.

In the semiconductor memory device according to the related art shown in FIG. 16, the mask data DM is input at the same timing as the write data DQ from the pad 13 dedicated to the mask data. In the case where the number of the row addresses is greater than the number of the column addresses or, specifically, in the case where there are 12 row addresses (12 bits of A00 to A11) and ten column addresses (10 bits of A00 to A09), two pads (address bits of A10 to A11) are not used when a column address is input.

A fourth embodiment of the invention described below is intended to utilize, for mask control, the two pads (address bits of A10 and A11) not used at the time of column address input.

Figure 18:
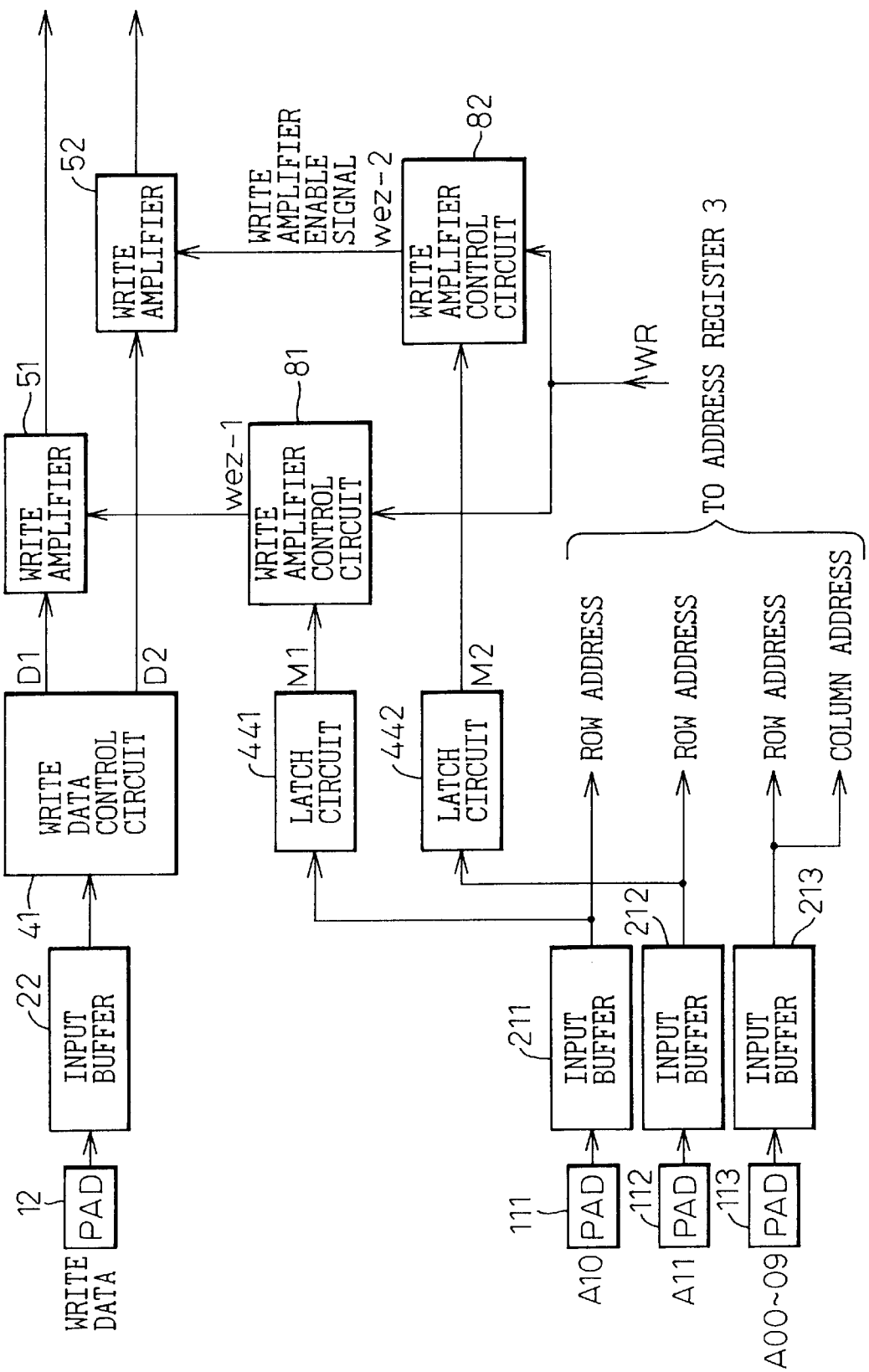
FIG. 18 is a block diagram showing a semiconductor memory device according to a fourth embodiment of the invention.
Figure 19:
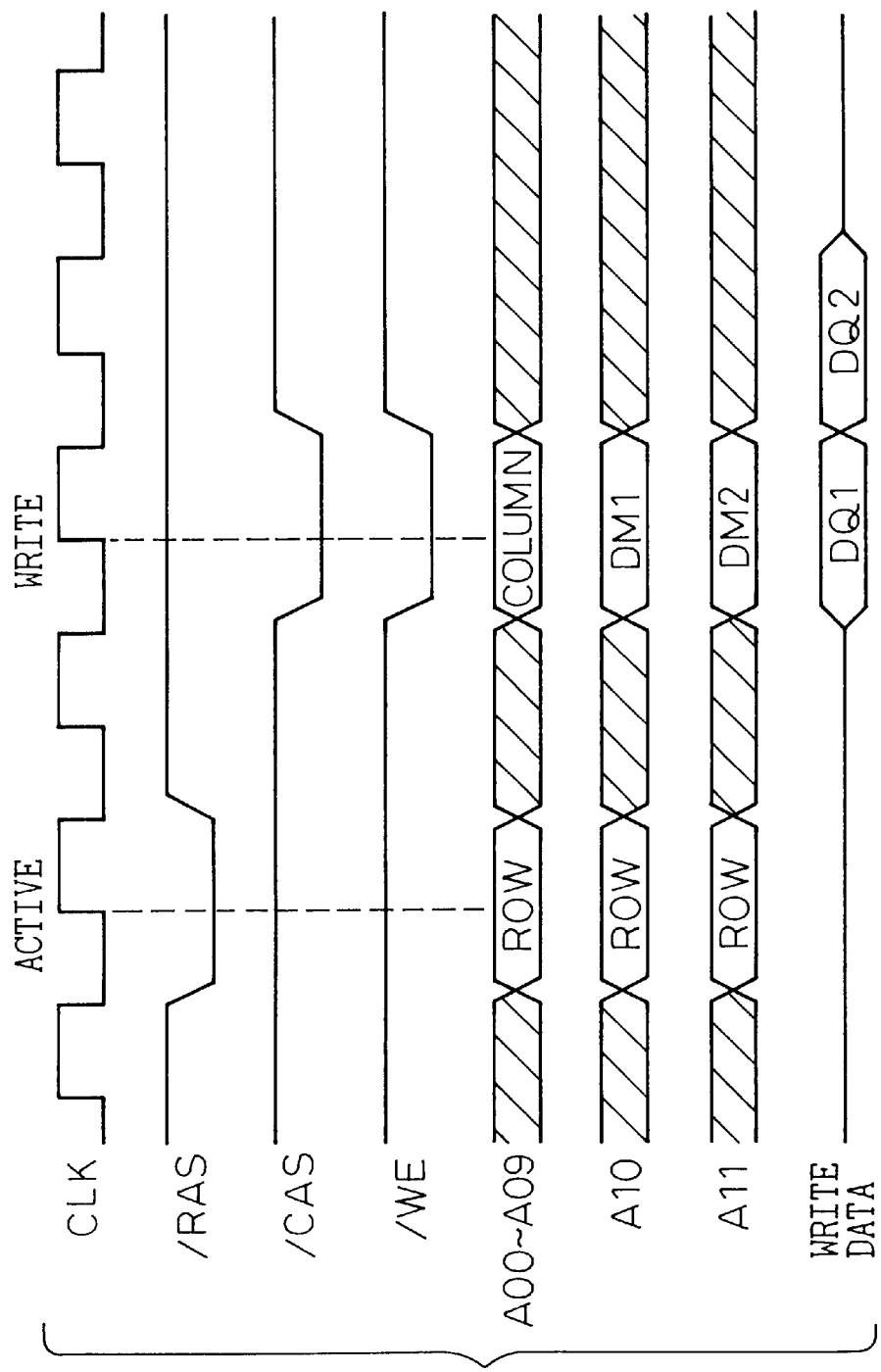
FIG. 19 is a timing chart for explaining the masking process for the semiconductor memory device shown in FIG. 18.

FIG. 18 is a block diagram showing a semiconductor memory device according to the fourth embodiment of the invention, and FIG. 19 is a timing chart for explaining the masking process for the semiconductor memory device of FIG. 18. In FIG. 18, the address register 3 and the command decoder 900 are similar to the corresponding parts of FIG. 16 and therefore are not shown. Also, in the fourth embodiment shown in FIGS. 18 and 19, the address data is configured with 12 bits of A00 to A11, of which the row address represents 12 bits of A00 to A11 and the column address 10 bits of A00 to A09. When the column address is input, the two address bits A10 and A11 are not used. The address data A00 to A09 are each associated with a pad and an input buffer, which are not shown for simplicity's sake. Neither the sense amplifiers nor the address register is shown for simplifying the explanation. Nevertheless, the configuration is similar to that of the first embodiment shown in FIG. 5.

As shown in FIGS. 18 and 19, according to this fourth embodiment, the address data A10, A11 applied through the pads 111, 112 and the input buffers 211, 212 not used at the time of column address input are used as the mask data DM1, DM2. Specifically, the pads 111, 112, the input buffers 211, 212 and the latch circuits 441, 442 for address data not used at the time of column address input according to the fourth embodiment are used as the pads 131, 132, the input buffers 231, 232 and the latch circuits 431, 432 explained with reference to FIGS. 9 to 12.

As described above, according to the fourth embodiment, no dedicated pad is used for the mask data unlike in the second embodiment.

Now, the operation of controlling the burst length will be explained in detail as another example of the semiconductor memory device according to the invention. Specifically, unlike the semiconductor memory device described above having the masking function with the burst write mode, the embodiment described below concerns the setting of the burst length itself.

Figure 20:
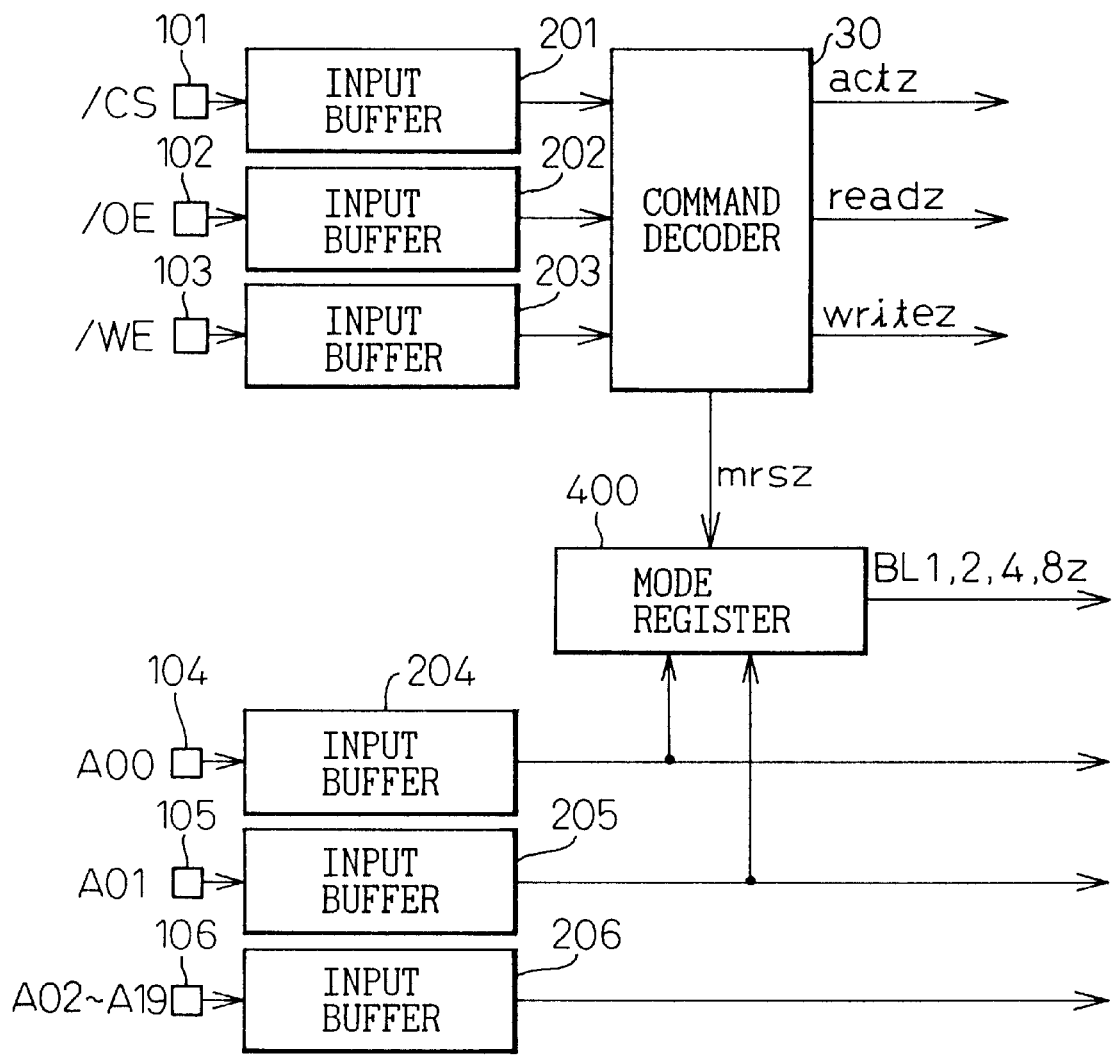
FIG. 20 is a block diagram schematically showing still another example of the semiconductor memory device according to the related art.

FIG. 20 is a block diagram schematically showing still another example of the semiconductor memory device according to the related art. This example is a semiconductor memory device of non-multiple address type in which all the addresses are input at a time. In FIG. 20, reference numerals 101 to 106 designate input pads, numerals 201 to 206 input buffers, numeral 30 a command data, and numeral 400 a mode register. The address data A02 to A19 are each provided with a pad and an input buffer which are not shown for simplicity's sake.

Figure 21:
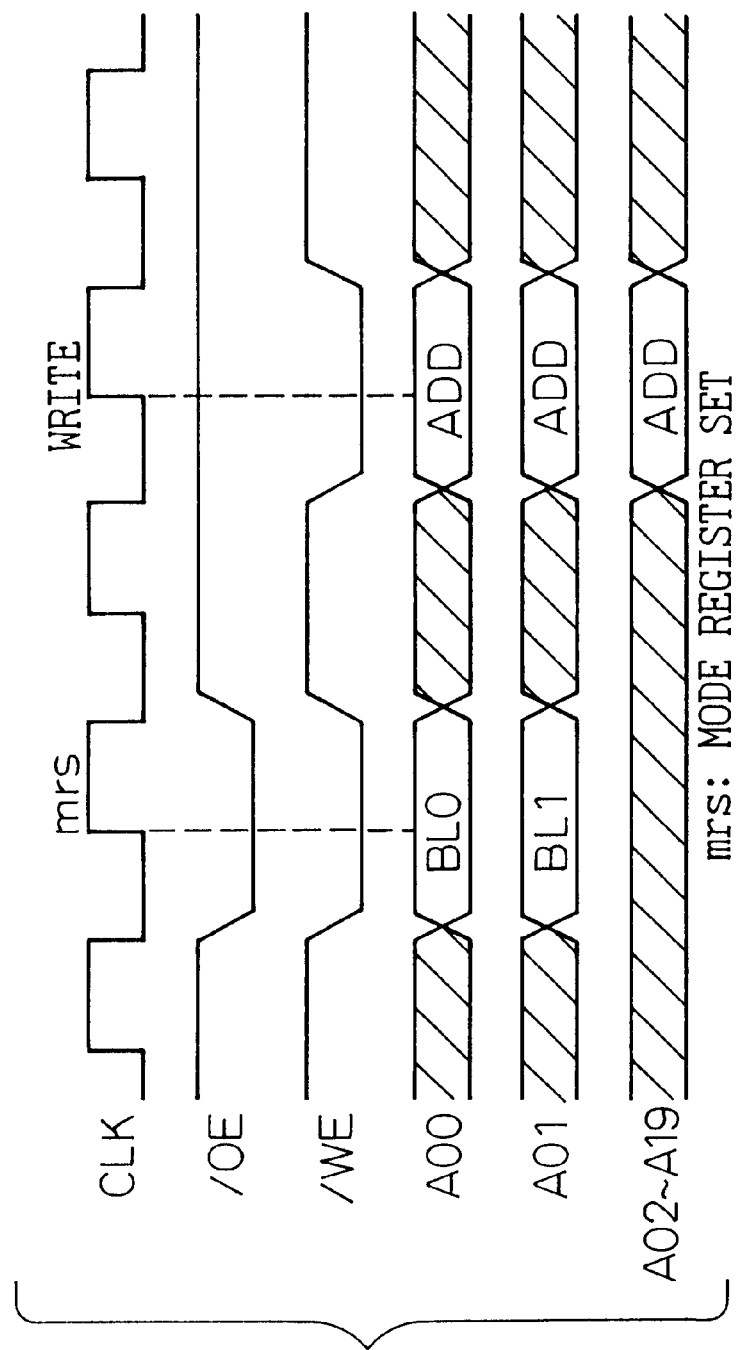
FIG. 21 is a timing chart for explaining the process for setting the burst length of the semiconductor memory device shown in FIG. 20.

FIG. 21 is a timing chart for explaining the process of setting the burst length for the semiconductor memory device of FIG. 20.

As shown in FIGS. 20 and 21, in the semiconductor memory device of non-multiple address type according to the related art, a mode register set command (mrs command) is required to be input for setting the burst length. At the same time as the mrs command, the burst length is set using the address data (A00 and A01).

Specifically, when the mrs command is input, a signal mrsz is output from the command decoder 90 to the mode register 300. The signal mrsz rises to high level "H" with the mode register set. In response to the high state "H" of the signal mrsz, the mode register 300 fetches the signals (address data) A00 and A01 and sets the burst length based on the combination of the two signals.

Figure 22:
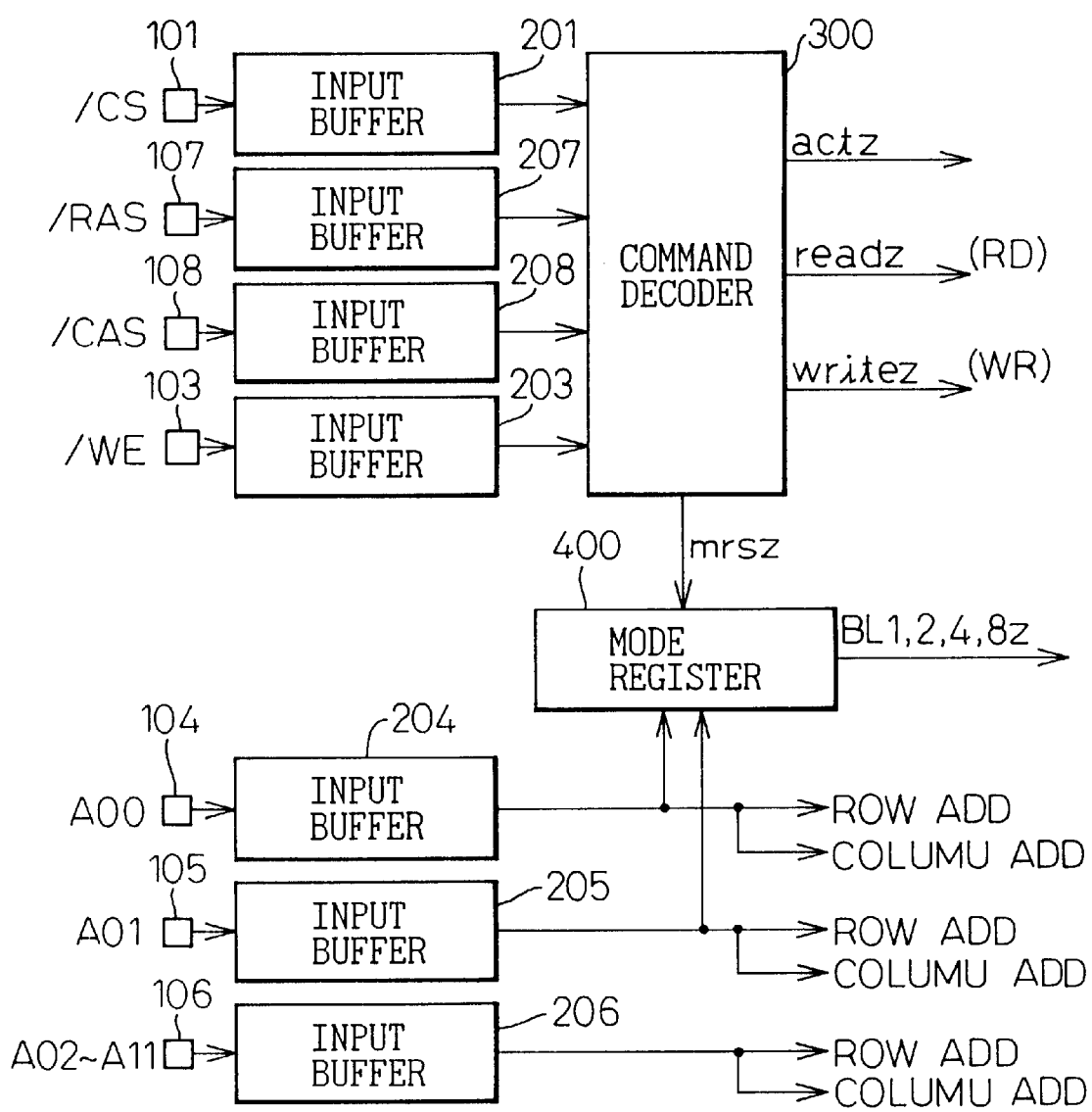
FIG. 22 is a block diagram schematically showing yet another example of the semiconductor memory device according to the related art.

FIG. 22 is a block diagram schematically showing still another example of the semiconductor memory device according to the related art, which represents a semiconductor memory device of multiple address type in which the address is input in two parts of RAS (row side) and CAS (column side). In FIG. 22, reference numerals 101, 103 to 108 designate input pads, numerals 201, 203 to 208 input buffers, numeral 300 a command decoder, and numeral 400 a mode register. The address data A02 to A11 are each associated with a pad and an input buffer which are not shown for simplicity's sake.

Figure 23:
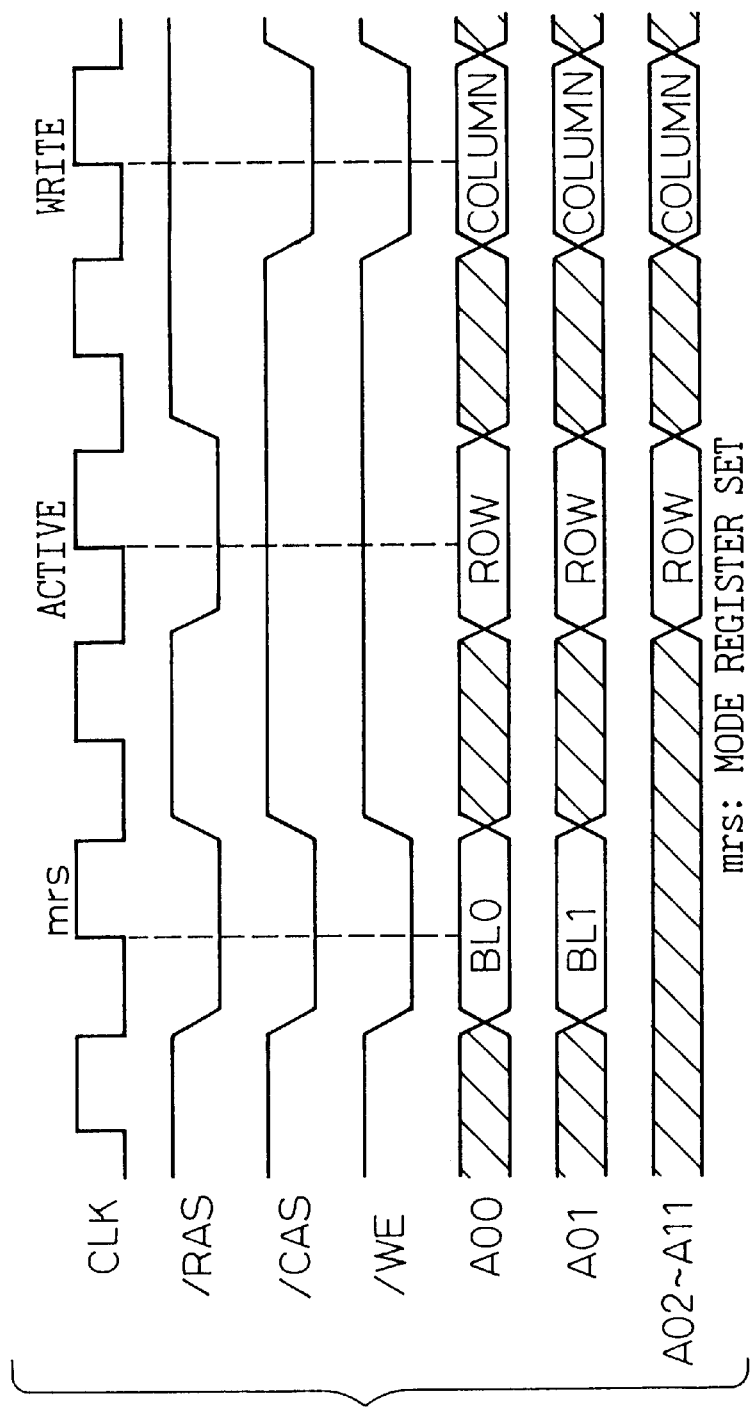
FIG. 23 is a timing chart for explaining the process for setting the burst length of the semiconductor memory device shown in FIG. 22.

FIG. 23 is a timing chart for explaining the process of setting the burst length for the semiconductor memory device shown in FIG. 22.

As shown in FIGS. 22 and 23, in the semiconductor memory device of a multiple address type according to the related art, as in the semiconductor memory device of non-multiple address type, the mrs command is required to be input for setting the burst length. The burst length is set using the signals A00 and A01 with the mrs command. Specifically, when the mrs command is input, the signal mrsz is output from the command decoder 900 to the mode register 300. In response to the high level "H" of the signal mrsz, the mode register 300 fetches the signals A00 and A01 and sets the burst length.

For the semiconductor memory device of either a multiple address type or a non-multiple address type described above, the write/read operation cannot be performed when the burst length is changed as the mrs command is required.

Figures 24, 25:
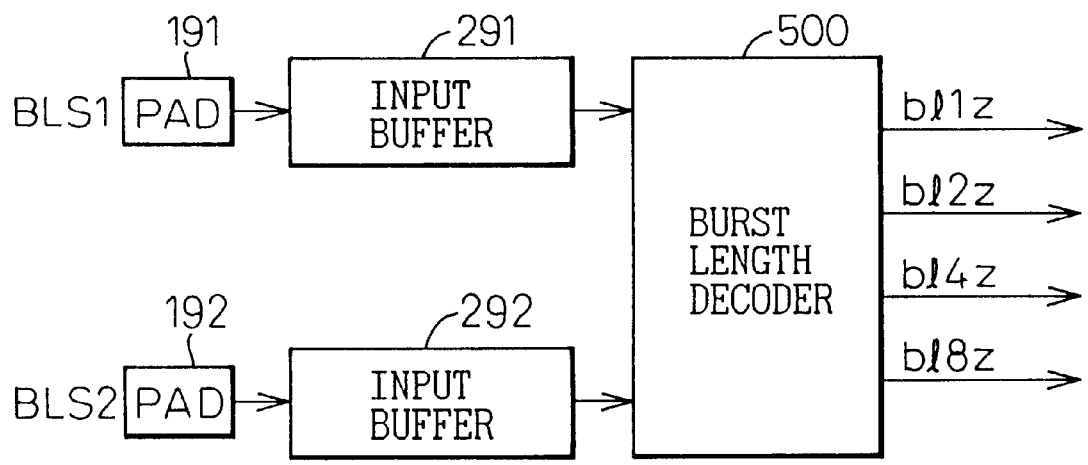
FIG. 24 is a block diagram showing a semiconductor memory device according to a fifth embodiment of the invention.
FIG. 25 is a diagram for explaining the process for setting the burst length of the semiconductor memory device shown in FIG. 24.
Figure 26:
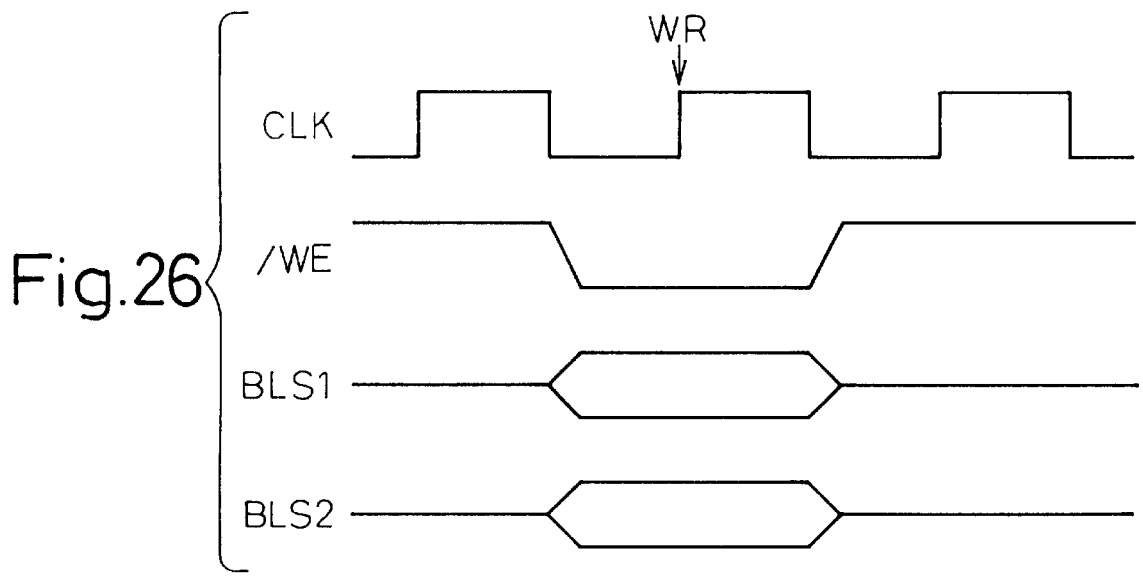
FIG. 26 is a timing chart for explaining the process for setting the burst length of the semiconductor memory device shown in FIG. 24.

FIG. 24 is a block diagram showing a semiconductor memory device according to a fifth embodiment of the invention, FIG. 25 a diagram for explaining the process of setting the burst length for the semiconductor memory device of FIG. 24, and FIG. 26 is a timing chart for explaining the process of setting the burst length for the semiconductor memory device of FIG. 24. In FIG. 24, reference numerals 191, 192 designate pads, numerals 291, 292 input buffers, and numeral 500 a burst length decoder.

As shown in FIGS. 24 and 26, according to the fifth embodiment, burst length signals BLS1, BLS2 are supplied to the burst length decoder 500 through new pads 191, 192, and at the same timing as the write signal WR is input with the write enable signal /WE at low level "L", the burst length information based on the burst length signals BLS1, BLS2 is fetched. The burst length decoder 500 outputs burst length setting signals b11z, b12z, b14z, b18z corresponding to the level (burst length information) of the burst length signals BLS1, BLS2.

Specifically, as shown in FIG. 25, in the case where the burst length signals BLS1, BLS2 are both "L", the burst length is set to 1 (BL=1; "H" only for b11z); in the case where the burst length signals BLS1, BLS2 are "H", "L", respectively, the burst length is set to 2 (BL=2; "H" only for b12z); in the case where the burst length signals BLS1, BLS2 are "L", "H", respectively, the burst length is set to 4 (BL=4; "H" only for b14z); and in the case where the burst length signals BLS1, BLS2 are both "H", the burst length is set to 8 (BL=8; "H" only for b18z).

Figure 27:
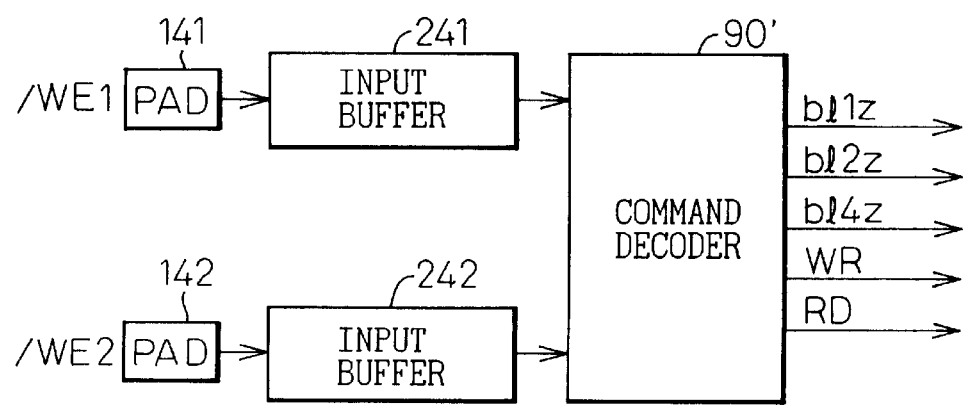
FIG. 27 is a block diagram showing a semiconductor memory device according to a sixth embodiment of the invention.
Figures 28, 29:
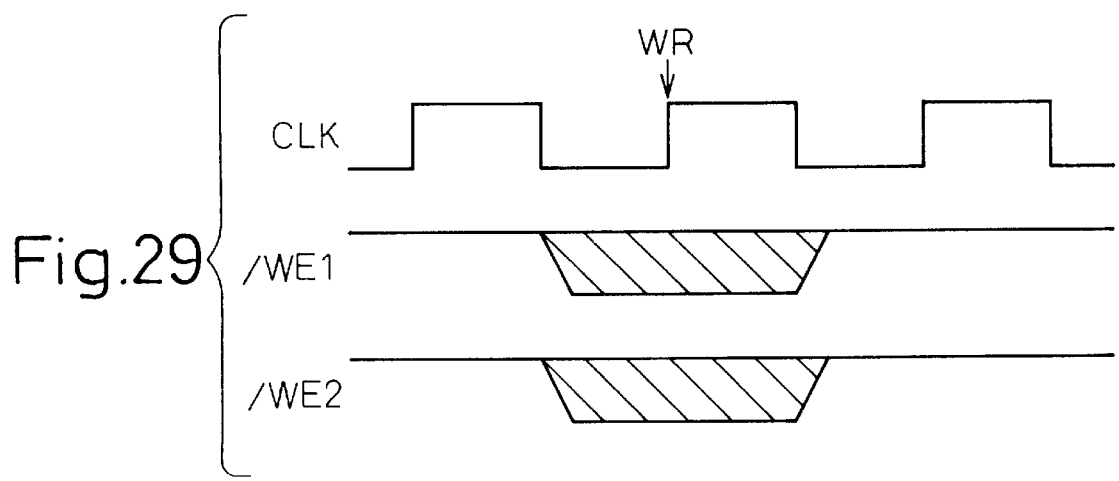
FIG. 28 is a diagram for explaining the process for setting the burst length of the semiconductor memory device shown in FIG. 27.
FIG. 29 is a timing chart for explaining the process for setting the burst length of the semiconductor memory device shown in FIG. 27.

FIG. 27 is a block diagram showing a semiconductor memory device according to a sixth embodiment of the invention, FIG. 28 is a diagram for explaining the process of setting the burst length for the semiconductor memory device of FIG. 27, and FIG. 29 is a timing chart for explaining the process of setting the burst length for the semiconductor memory device of FIG. 27. In FIG. 27, reference numerals 141, 142 designate pads, numerals 241, 242 input buffers, and numeral 90' a command decoder.

As shown in FIGS. 27 and 29, according to the sixth embodiment, the burst length information is applied to the command decoder 90' at the timing when the write signal WR is input by the two write enable signals /WE1, /WE2, thereby outputting the burst length setting signals b11z, b12z, b14z corresponding to the level of the write enable signals /WE1 /WE2 (burst length information).

According to this sixth embodiment, the write enable signals /WE1 /WE2 are used in place of the dedicated burst length signals BLS1, BLS2 for setting the burst length according to the fifth embodiment described above. Specifically, in the semiconductor memory device of FIG. 5 described above, the information for setting the burst length for the pads 141, 142 used for mask control is applied to the command decoder 90' according to the combination of the write enable signals /WE1 /WE2.

Specifically, as shown in FIG. 28, when the write enable signals /WE1 /WE2 are both "L", the burst length is set to 1 (BL=1; "H" only for b11z); in the case where the burst length signals /WE1, /WE2 are "H", "L", respectively, the burst length is set to 2 (BL=2; "H" only for b12z); in the case where the burst length signals /WE1, /WE2 are "L", "H", respectively, the burst length is set to 4 (BL=4; "H" only for b14z); and in the case where the write enable signals /WE1 /WE2 are both "H", the write operation is not performed.

Figure 30:
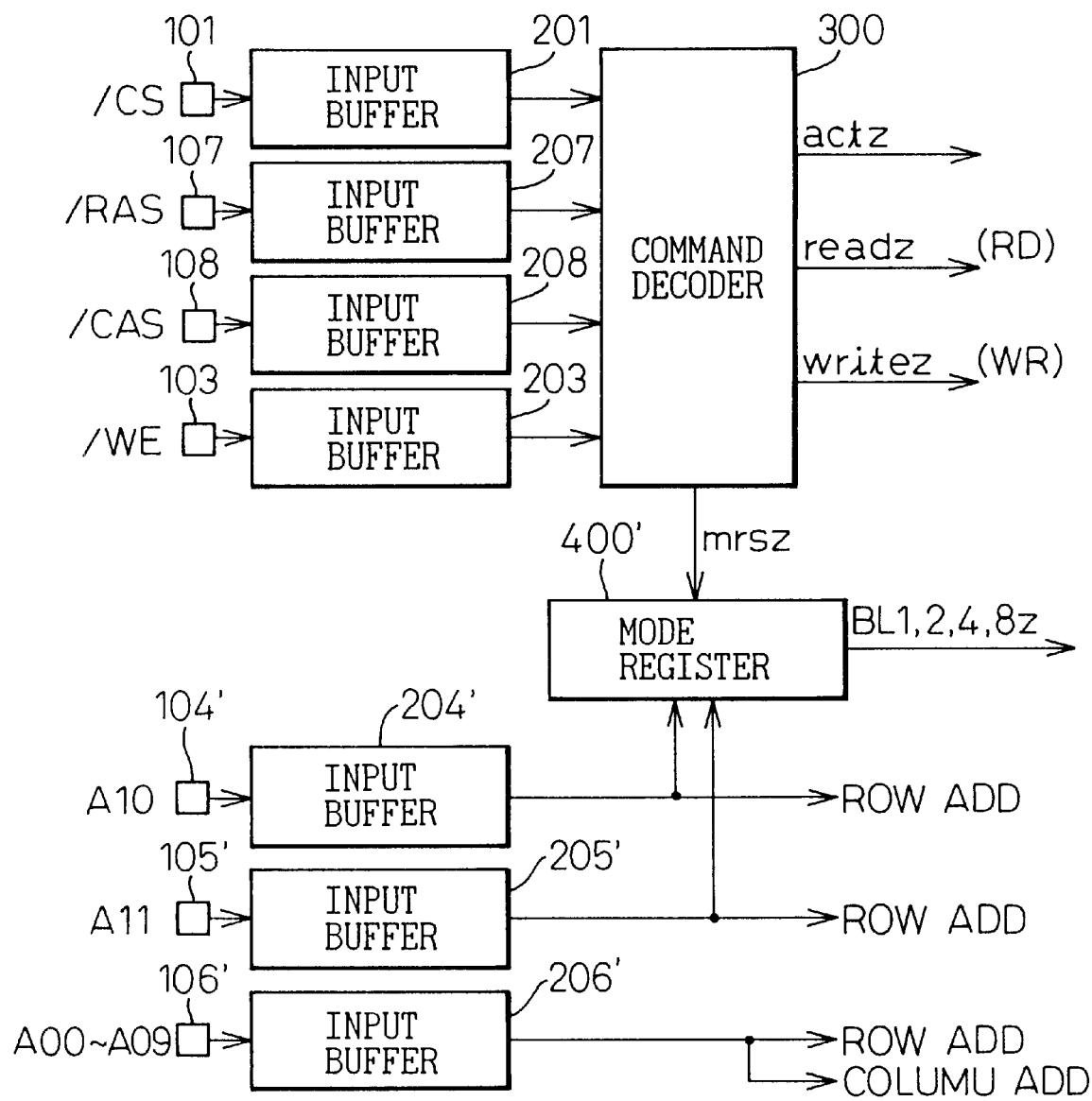
FIG. 30 is a block diagram showing a semiconductor memory device according to a seventh embodiment of the invention.

FIG. 30 is a block diagram showing a semiconductor memory device according to a seventh embodiment of the invention, representing a semiconductor memory device of multiple address type in which the address is input in two parts of RAS and CAS. In FIG. 30, reference numerals 101, 103, 104', 105', 106', 107, 108 designate input pads, numerals 201, 203, 204', 205', 206', 207, 208 designate input buffers, numeral 300 designates a command decoder, and numeral 400 designates a mode register. The address data A00 to A09 are each associated with a pad and an input buffer, which are not shown for simplicity's sake.

Figure 31:
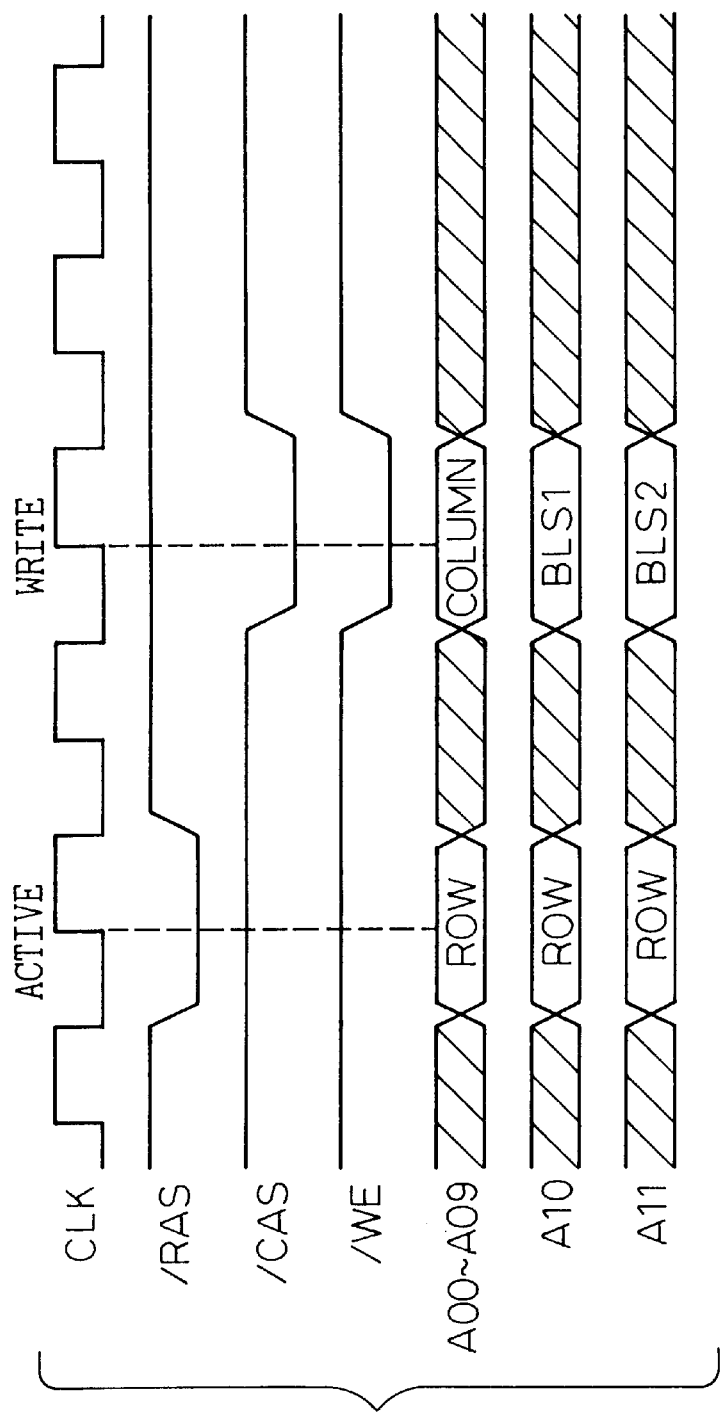
FIG. 31 is a timing chart for explaining the process for setting the burst length of the semiconductor memory device shown in FIG. 30.

FIG. 31 is a timing chart for explaining the process of setting the burst length for the semiconductor memory device of FIG. 30.

In the semiconductor memory device according to the seventh embodiment like the fourth embodiment described with reference to FIGS. 18 and 19, the address data A10, A11 applied through the pads 104', 105' and the input buffers 204', 205' not used at the time of column address input are used as burst signals providing the burst length information. Specifically, according to the seventh embodiment, the address data A10, A11 (the pads 104', 105' and the input buffers 204', 205') not used at the time of column address input in the seventh embodiment are used as the burst length signals BLS1, BLS2 (the pads 191, 192, and the input buffers 291, 292) in the fifth embodiment described above with reference to FIGS. 24 to 26. In this way, the burst length is set by the address data A10, A11 not used at the time of the column address input, and therefore no new dedicated pad is required.

As described above, according to the fifth to seventh embodiments of the invention, the mrs command for the related art described above with reference to FIGS. 20 to 23 is not required, and the burst length can be set also at the time of the read operation as well as at the time of the write operation.

Figure 32:
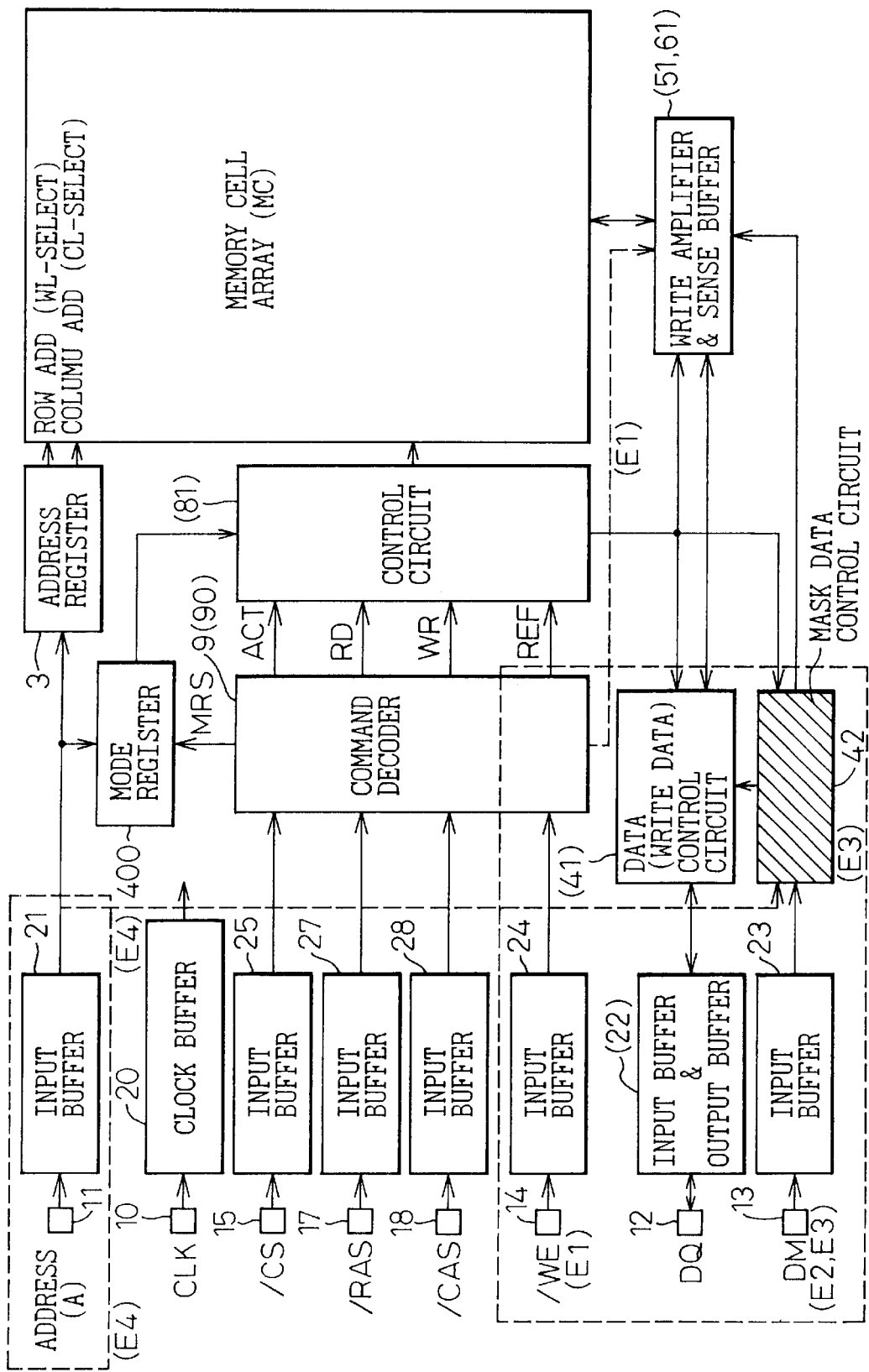
FIG. 32 is a diagram showing a general configuration of an example of the semiconductor memory device according to the present invention.

FIG. 32 is a diagram showing a general configuration of an example of the semiconductor memory device according to the invention. This is a general block diagram of the SDRAM for understanding the mask control in the first to fourth embodiments of the invention. In the semiconductor memory device of FIG. 32, the component parts in the aforementioned embodiments are designated by the same reference numerals, respectively.

As shown in FIG. 32, the SDRAM is supplied with the clock CLK, the control signals /CS, /RAS, /CAS, /WE, the address A, the data (write data DQ), the mask control signal DM, etc. The control signals have different numbers and names for different chips.

The clock CLK is sent to each circuit in the chip through the pad 10 and the clock buffer 20. The control signals /CS, /RAS, /CAS, /WE are input to the command decoder 9 (90) through the pads 15, 17, 18, 14, and depending on the signal combination, a command (active ACT, read RD, write WR, refresh REF, mode register set MRS, etc.) is specified and sent to the control circuits (including the write amplifier control circuit 81).

At the time of write operation, the write data DQ is sent through the pad 12, the input buffer 22 and the write data control circuit 41 (the data control circuit) to the write amplifier 51, and written in the cell (memory cell MC) through the sense amplifier 61. At the time of reading, the data output from the cell MC is amplified at the sense buffer (sense amplifier 61), and, through the read data control circuit (data control circuit 41) and the output buffer 22, output from the pad 12.

In FIG. 32, the configuration associated with the first embodiment described above is designated by reference numeral E1, the configuration associated with the second embodiment by E2, the configuration associated with the third embodiment by E3, and the configuration associated with the fourth embodiment by E4. Specifically, in the first embodiment, the mask control operation is performed by the increased control signals (/WE: /WE1, /WE2); in the second embodiment, the mask control operation is performed by supplying parallel mask data; in the third embodiment, the mask processing operation is performed by the write data of a plurality of bits for one mask data pad; and in the fourth embodiment, the mask processing operation is performed by the address signal (the address data A10, A11 not used at the time of column address input).

Figure 33:
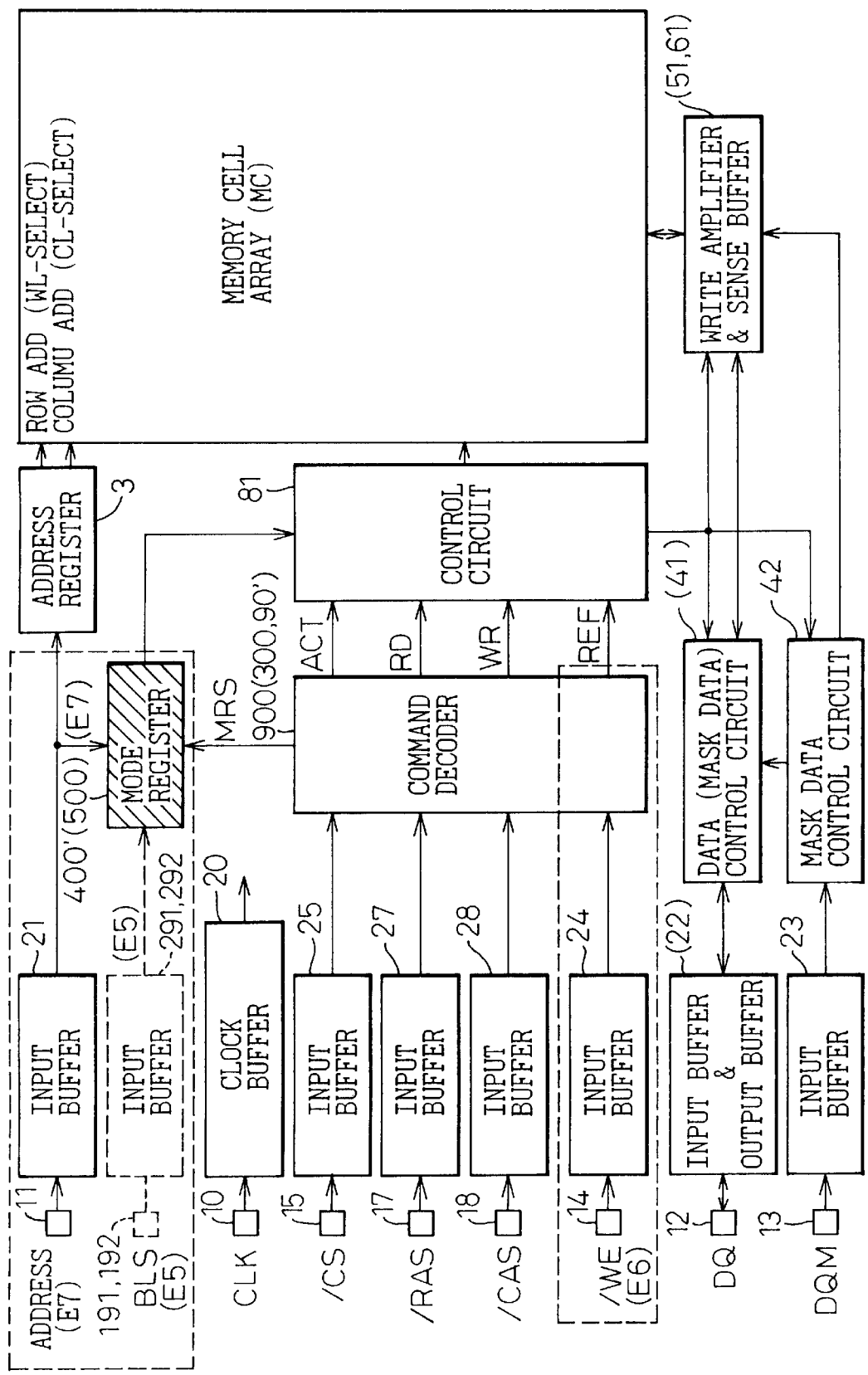
FIG. 33 is a diagram showing a general configuration of another example of the semiconductor memory device according to the present invention.

FIG. 33 is a diagram showing a general configuration of another example of the semiconductor memory device according to this invention, and is a general block diagram of the SDRAM for understanding the burst length control according to the fifth to seventh embodiments of the invention. In the semiconductor memory device shown in FIG. 32, the parts of the configuration similar to FIG. 32 are designated by the same reference numerals, respectively.

In FIG. 33, the configuration associated with the fifth embodiment is designated by reference numeral E5, the configuration associated with the sixth embodiment is designated by reference numeral E6, and the configuration associated with the seventh embodiment is designated by reference numeral E7. Specifically, according to the fifth embodiment, the burst length signal BLS (BLS1, BLS2) is input from the dedicated pads 191, 192 to set the burst length; according to the sixth embodiment, the burst length is set by the increased control signal (/WE: /WE1, /WE2); and according to the seventh embodiment, the burst length is set by the address signal (the address data A10, A11 not used at the time of column address input).

The foregoing description mainly refers to the SDRAM as the semiconductor memory device. The present invention, however, is widely applicable to semiconductor memory devices having a burst mode.

It will thus be understood from the foregoing detailed description that according to this invention, there is provided a semiconductor memory device in which the data transfer rate can be improved by increasing the mask processing rate in burst write mode. Also, according to the invention, there is provided a semiconductor memory device in which the burst length can be set without inputting a mode register set command.

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor memory device having a burst write mode, wherein a plurality of input data are provided in serial to a data terminal and a plurality of mask data are provided, comprising:

a mask data input circuit for receiving said plurality of mask data before the last input data of said plurality of input data is provided to said data terminal; and a plurality of write enable signal terminals for receiving a plurality of write enable signals as said plurality of mask data, wherein said mask data input circuit is coupled to said plurality of write enable signal terminals.

2. For semiconductor memory device as claimed in claim 1, wherein a mask control operation is performed in said burst write mode in response to said write enable signals.

3. The semiconductor memory device as claimed in claim 2, wherein said plurality of the write enable signals are decoded thereby to mask an arbitrary of a plurality of continuous write data in said burst write mode.

4. The semiconductor memory device as claimed in claim 1, wherein said write enable signals are input in parallel through said write enable signal terminals, and a mask control operation is performed in said burst write mode by said plurality of the write enable signals.

5. A semiconductor memory device having a burst write mode, wherein a plurality of input data are provided in serial to a data terminal and a plurality of mask data are provided, comprising:

a mask data input circuit for receiving said plurality of mask data before the last input data of said plurality of input data is provided to said data terminal; and a plurality of mask data terminals for receiving said plurality of mask data, wherein said mask data input circuit is coupled to said plurality of mask data terminals.

6. The semiconductor memory device as claimed in claim 5, wherein the number of said mask data terminals is the same as that of said mask data.

7. The semiconductor memory device as claimed in claim 5, wherein the number of said mask data terminals is less than that of said mask data.

8. The semiconductor memory device as claimed in claim 5, wherein a mask control operation is performed in said burst write mode in response to said plurality of mask data.

9. The semiconductor memory device as claimed in claim 8, wherein said plurality of mask data are decoded thereby to mask an arbitrary one of a plurality of continuous write data in said burst write mode.

10. The semiconductor memory device as claimed in claim 5, wherein said mask data are input in parallel through mask data signal terminals, and a mask control operation is performed in said burst write mode by said plurality of mask data.

11. A semiconductor memory device, comprising:

a data terminal for receiving a plurality of bits of data serially;

a serial-parallel conversion circuit receiving the plurality of bits of data for transmitting the plurality of bits of data in parallel to memory cells;

a mask control circuit for receiving a plurality of bits of mask control signals, each bit corresponding to one of the plurality of bits of data, and for controlling a parallel transmission of said plurality of bits of data from the serial-parallel conversion circuit in response to the mask control signals;

wherein the semiconductor memory device receives a final bit of the mask control signal before receiving a final bit of the plurality of bits of data inputted via the data terminal.

12. The semiconductor memory device as claimed in claim 11, comprising:

a plurality of mask control terminals for receiving said mask control signals in parallel.

13. The semiconductor memory device as claimed in claim 11, comprising:

an address terminal for receiving an address signal to designate the memory cell to be written wherein said mask control signals are inputted through the address terminal.

* * * * *